United States Patent
Ouderkirk et al.

(10) Patent No.: US 11,885,991 B1
(45) Date of Patent: Jan. 30, 2024

(54) DISPLAY DEVICES AND METHODS FOR PROCESSING LIGHT

(71) Applicant: META PLATFORMS TECHNOLOGIES, LLC, Menlo Park, CA (US)

(72) Inventors: Andrew John Ouderkirk, Kirkland, WA (US); James Ronald Bonar, Redmond, WA (US); Jasmine Soria Sears, Kirkland, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 593 days.

(21) Appl. No.: 17/139,722

(22) Filed: Dec. 31, 2020

Related U.S. Application Data

(63) Continuation of application No. 16/530,678, filed on Aug. 2, 2019, now Pat. No. 10,921,499, which is a continuation-in-part of application No. 16/006,734, filed on Jun. 12, 2018, now Pat. No. 10,453,828.

(60) Provisional application No. 62/804,105, filed on Feb. 11, 2019.

(51) Int. Cl.
   *G02B 27/01* (2006.01)
   *G02B 5/18* (2006.01)
   *G02B 5/02* (2006.01)

(52) U.S. Cl.
   CPC ......... *G02B 5/1842* (2013.01); *G02B 5/0278* (2013.01); *G02B 27/0172* (2013.01); *G02B 2027/0147* (2013.01); *G02B 2027/0178* (2013.01)

(58) Field of Classification Search
   None
   See application file for complete search history.

(56) References Cited

U.S. PATENT DOCUMENTS

| | | |
|---|---|---|
| 3,520,150 A | 7/1970 | McNeely et al. |
| 8,520,150 B2 | 8/2013 | Yokota |
| 10,453,828 B1 | 10/2019 | Ouderkirk et al. |

(Continued)

OTHER PUBLICATIONS

Anonymous, "Pulse-Amplitude-Modulation Drive Control of LEDs," Jul. 2, 2002, ip.com Journal, ip.com Inc, West Henrietta, NY, XP013003659, 13 pages.

(Continued)

*Primary Examiner* — Benjamin P Sandvik
(74) *Attorney, Agent, or Firm* — Morgan, Lewis & Bockius LLP

(57) ABSTRACT

A display device includes a display panel including a first array of light emitters having a first spacing in a first emission region of the display panel and a second array of light emitters having a second spacing in a second emission region of the display panel. The second spacing is distinct from the first spacing. The display device includes an optical filter including a first filter region and a second filter region. The first filter region changes distribution of first light from the first array of light emitters impinging on the first filter region so that the first light has a first distribution after passing through the first filter region. The second filter region changes distribution of second light from the second array of light emitters impinging on the second filter region so that the second light has a second distribution after passing through the second filter region.

20 Claims, 20 Drawing Sheets

(56) References Cited

U.S. PATENT DOCUMENTS

| | | | |
|---|---|---|---|
| 10,854,583 | B1 | 12/2020 | Ouderkirk et al. |
| 10,921,499 | B1* | 2/2021 | Ouderkirk .............. G06F 3/013 |
| 10,930,216 | B2 | 2/2021 | Yi et al. |
| 2003/0210222 | A1 | 11/2003 | Ogiwara et al. |
| 2007/0101927 | A1 | 5/2007 | Keyser et al. |
| 2008/0297604 | A1 | 12/2008 | Imai et al. |
| 2009/0126975 | A1 | 5/2009 | Kondo |
| 2009/0294921 | A1 | 12/2009 | Grillberger et al. |
| 2013/0063557 | A1 | 3/2013 | Saigo et al. |
| 2014/0374649 | A1 | 12/2014 | Chen et al. |
| 2015/0116388 | A1 | 4/2015 | Asanuma et al. |
| 2016/0127717 | A1* | 5/2016 | Petrov ..................... G09G 3/36 345/100 |
| 2017/0103697 | A1 | 4/2017 | Kawashima et al. |
| 2017/0133638 | A1 | 5/2017 | Takahashi et al. |
| 2017/0207105 | A1 | 7/2017 | Kasai et al. |
| 2017/0210953 | A1 | 7/2017 | Bernt et al. |
| 2017/0285344 | A1 | 10/2017 | Benko et al. |
| 2017/0290098 | A1 | 10/2017 | Kautzsch et al. |
| 2018/0045385 | A1 | 2/2018 | Tyukhova et al. |
| 2018/0047325 | A1 | 2/2018 | Biwa et al. |
| 2018/0137602 | A1 | 5/2018 | Spitzer et al. |
| 2018/0190190 | A1 | 7/2018 | Xi et al. |
| 2018/0269266 | A1 | 9/2018 | Cancel Olmo et al. |
| 2018/0335668 | A1 | 11/2018 | Fan et al. |
| 2018/0342572 | A1 | 11/2018 | Park et al. |
| 2019/0005915 | A1 | 1/2019 | Liu et al. |
| 2019/0109184 | A1 | 4/2019 | Li et al. |
| 2019/0164954 | A1 | 5/2019 | Yang et al. |
| 2019/0227319 | A1* | 7/2019 | Trail ..................... G09G 3/002 |
| 2020/0006457 | A1 | 1/2020 | Gu |
| 2020/0052045 | A1 | 2/2020 | Kuo et al. |
| 2020/0052052 | A1 | 2/2020 | Nishimura |
| 2020/0132997 | A1 | 4/2020 | Ouderkirk et al. |
| 2020/0170126 | A1 | 5/2020 | Ahn et al. |
| 2020/0192100 | A1* | 6/2020 | Jeong ..................... H10K 59/35 |
| 2020/0227488 | A1 | 7/2020 | Xin et al. |
| 2020/0335043 | A1 | 10/2020 | Zhao et al. |
| 2021/0080637 | A1* | 3/2021 | Brick ................. G02B 27/0172 |
| 2021/0201802 | A1 | 7/2021 | Yi et al. |
| 2021/0248945 | A1 | 8/2021 | Liu et al. |
| 2021/0265430 | A1 | 8/2021 | Chang et al. |
| 2022/0209148 | A1 | 6/2022 | Park et al. |

OTHER PUBLICATIONS

Final Office Action dated Aug. 2, 2021 for U.S. Appl. No. 16/171,135, filed Oct. 25, 2018, 10 Pages.
Final Office Action dated Mar. 15, 2023 for U.S. Appl. No. 16/521,908, filed Jul. 25, 2019, 19 pages.
International Preliminary Report on Patentability for International Application No. PCT/US2019/058128, dated May 6, 2021, 16 Pages.
International Search Report and Written Opinion for International Application No. PCT/US2019/058128, dated Apr. 3, 2020, 21 Pages.
Non-Final Office Action dated Aug. 2, 2022 for U.S. Appl. No. 16/521,908, filed Jul. 25, 2019, 18 pages.
Non-Final Office Action dated Feb. 10, 2021 for U.S. Appl. No. 16/171,135, filed Oct. 25, 2018, 10 pages.
Non-Final Office Action dated Mar. 13, 2019 for U.S. Appl. No. 16/006,734, filed Jun. 12, 2018, 13 pages.
Non-Final Office Action dated Apr. 14, 2020 for U.S. Appl. No. 16/557,838, filed Aug. 30, 2019, 18 pages.
Non-Final Office Action dated Feb. 18, 2021 for U.S. Appl. No. 16/785,258, filed Feb. 7, 2020, pages.
Non-Final Office Action dated Aug. 20, 2020 for U.S. Appl. No. 16/179,752, filed Nov. 2, 2018, 12 pages.
Notice of Allowance dated Jul. 10, 2019 for U.S. Appl. No. 16/006,734, filed Jun. 12, 2018, 5 pages.
Notice of Allowance dated Mar. 13, 2023 for U.S. Appl. No. 17/403,697, filed Aug. 16, 2021, 2 pages.
Notice of Allowance dated Oct. 18, 2021 for U.S. Appl. No. 16/171,135, filed Oct. 25, 2018, 9 pages.
Notice of Allowance dated Feb. 26, 2021 for U.S. Appl. No. 16/179,752, filed Nov. 2, 2018, 8 pages.
Notice of Allowance dated Jul. 27, 2020 for U.S. Appl. No. 16/557,838, filed Aug. 30, 2019, 5 pages.
Notice of Allowance dated Nov. 28, 2022 for U.S. Appl. No. 17/403,697, filed Aug. 16, 2021, 10 pages.
Notice of Allowance dated Oct. 28, 2020 for U.S. Appl. No. 16/530,678, filed Aug. 2, 2019, 10 pages.
Notice of Allowance dated Nov. 30, 2020 for U.S. Appl. No. 16/179,752, filed Nov. 2, 2018, 16 pages.
Restriction Requirement dated Oct. 1, 2020 for U.S. Appl. No. 16/171,135, filed Oct. 25, 2018, 7 Pages.

* cited by examiner

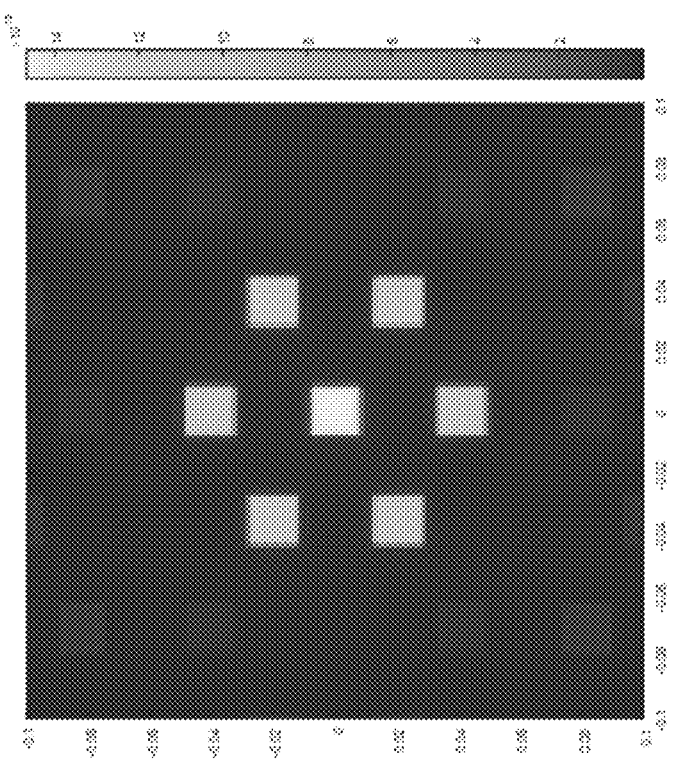
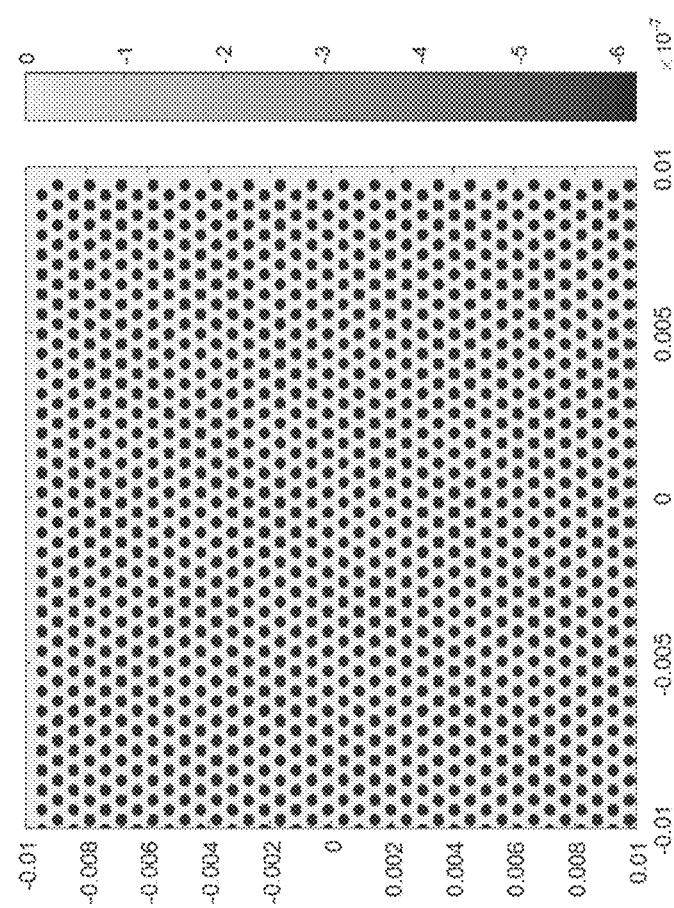
Figure 12C

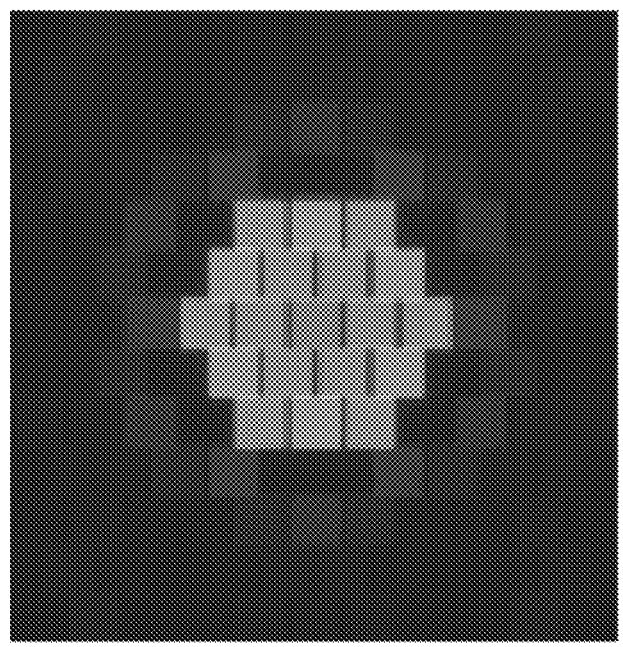
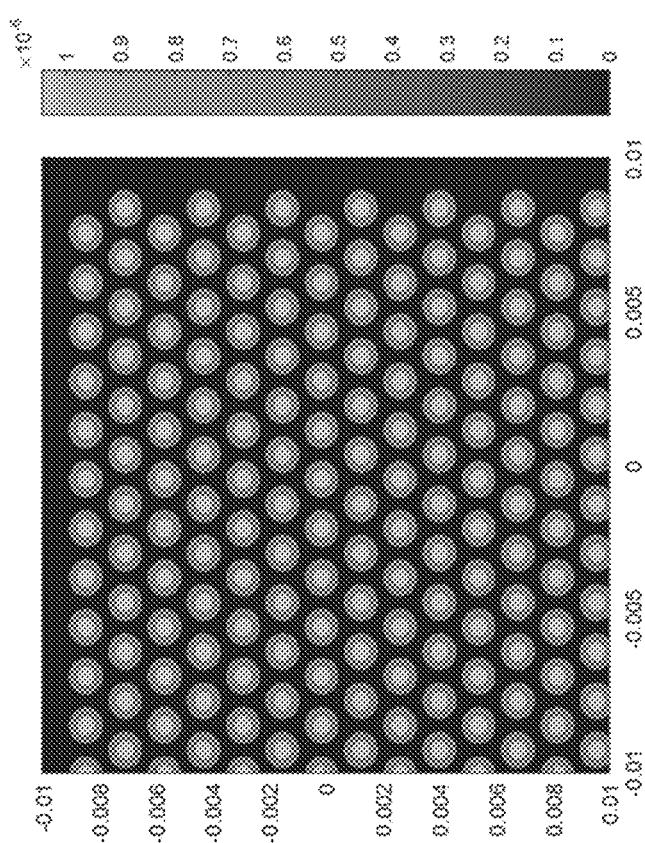
Figure 13B

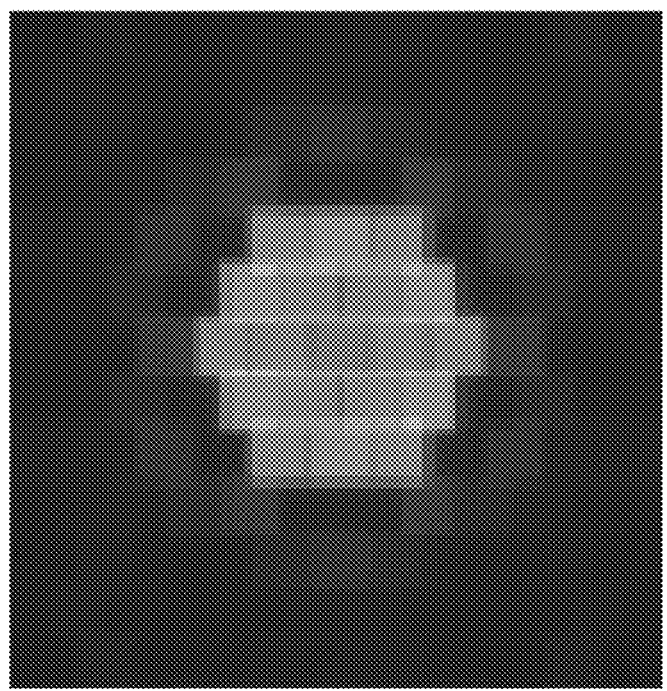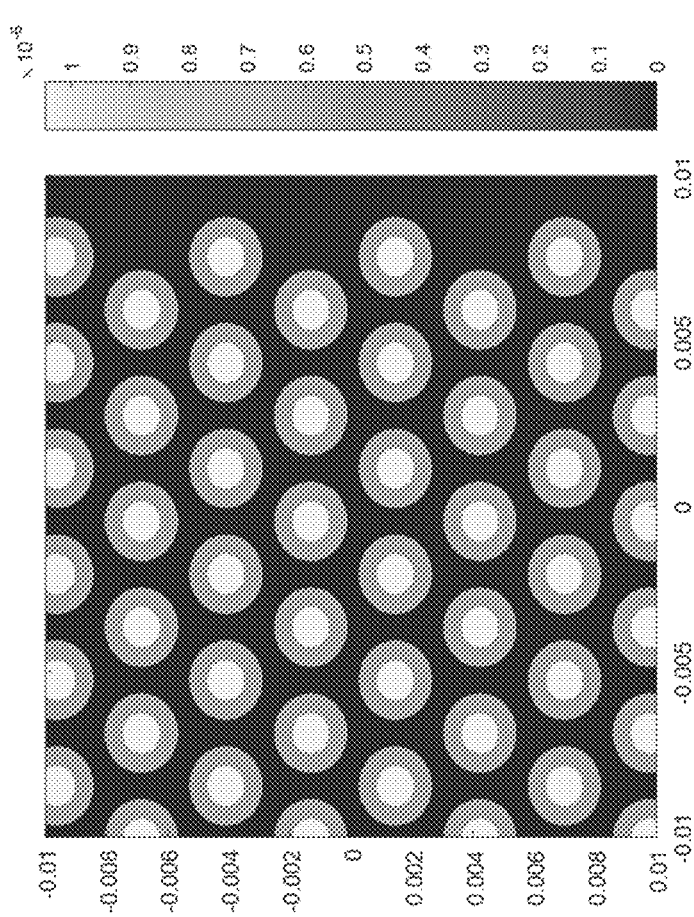
Figure 13C

1400 Process light projected by a display panel having a first emission region and a second emission region that is mutually exclusive to the first emission region and surrounds the first emission region.

1410 Cause, with a first filter region configured to change a direction of at least a portion of light emitted by a plurality of light emitters arranged in the first emission region, a first distribution of light emitted from a first light emitter of two light emitters of the plurality of light emitters in the first emission region and a second distribution of light emitted from a second light emitter of the two light emitters of the plurality of light emitters in the first emission region so that the first distribution at least partially overlaps with the second distribution. The two light emitters, that are adjacent to each other, in the first emission region are spaced apart from each other by a first representative distance. Cause, with a second filter region configured to change a direction of at least a portion of light emitted by a plurality of light emitters arranged in the second emission region, a third distribution of light emitted from a first light emitter of two light emitters of the plurality of light emitters in the second emission region and a fourth distribution of light emitted from a second light emitter of the two light emitters of the plurality of light emitters in the second emission region so that the third distribution at least partially overlaps with the fourth distribution. The two light emitters, that are adjacent to each other, in the second emission region are spaced apart from each other by a second representative distance that is greater than the first representative distance.

1411 A distance from a light emitter in the second emission region to the second filter region is greater than a distance from a light emitter in the first emission region to the first filter region

Figure 14

DISPLAY DEVICES AND METHODS FOR PROCESSING LIGHT

RELATED APPLICATIONS

This application is a continuation of U.S. patent application Ser. No. 16/530,678, entitled "Display Devices and Methods for Processing Light," filed Aug. 2, 2019, which is a continuation-in-part application of U.S. patent application Ser. No. 16/006,734, entitled "Foveated Rendering Display Devices And Methods Of Making The Same," filed Jun. 12, 2018, now U.S. Pat. No. 10,453,828, issued Oct. 22, 2019, and claims priority to U.S. Provisional Patent Application Ser. No. 62/804,105, entitled "Display Devices and Methods for Processing Light," filed Feb. 11, 2019, all of which are incorporated by reference herein in their entirety.

This application is also related to U.S. patent application Ser. No. 16/557,838, entitled "Foveated Rendering Display Devices and Methods of Making the Same," filed Aug. 30, 2019, now U.S. Pat. No. 10,854,583, issued Dec. 1, 2020, U.S. patent application Ser. No. 16/785,258, entitled "Display Devices and Methods of Making the Same," filed Feb. 7, 2020, U.S. patent application Ser. No. 16/171,135, entitled "Color Foveated Display Devices and Methods of Making the Same," filed Oct. 25, 2018, and U.S. patent application Ser. No. 16/179,752, entitled "Color Foveated Display Devices and Methods of Making the Same," filed Nov. 2, 2018.

TECHNICAL FIELD

This relates generally to head-mounted display devices, and more specifically to optical components used in head-mounted display devices.

BACKGROUND

Head-mounted display devices (also called herein head-mounted displays) are gaining popularity as means for providing visual information to users.

One or more displays used in head-mounted typically have a plurality of light emitters. However, due to the proximity of the one or more displays to eyes of a user, in some cases, the user can see the gap between light emitters arranged in the one or more display panels. This phenomenon is often called a screen-door effect.

The screen-door effect reduces the quality of user experience with head-mounted display devices.

SUMMARY

Accordingly, there is a need for head-mounted display devices with reduced or no screen-door effect.

The above deficiencies and other problems are reduced or eliminated by the disclosed devices, systems, and methods.

In accordance with some embodiments, an optical filter includes a first filter region configured to cause distribution of light impinging on the first filter region in a first manner so that light from two emitters having a first distance between the two emitters with a gap between the two emitters appears to be emitted from two emitters positioned without a gap between the two emitters; and a second filter region configured to cause distribution of light impinging on the second filter region in a second manner so that light from two emitters having a second distance that is different from the first distance between the two emitters with a gap between the two emitters appears to be emitted from two emitters positioned without a gap between the two emitters.

In accordance with some embodiments, a display device includes any optical filter described herein and a display panel. The display panel includes a plurality of light emitters in a first emission region of the display panel and a plurality of light emitters in a second emission region of the display panel that is distinct from and mutually exclusive to the first emission region and surrounds the first emission region. Two light emitters, that are adjacent to each other, in the first emission region are spaced apart from each other by a first representative distance. Two light emitters, that are adjacent to each other, in the second emission region are spaced apart from each other by a second representative distance that is greater than the first representative distance.

In accordance with some embodiments, a display device includes a display panel including a plurality of light emitters in a first emission region of the display panel, and a plurality of light emitters in a second emission region of the display panel that is distinct from and mutually exclusive to the first emission region and surrounds the first emission region. Two light emitters, that are adjacent to each other, in the first emission region are spaced apart from each other by a first representative distance, and two light emitters, that are adjacent to each other, in the second emission region are spaced apart from each other by a second representative distance that is greater than the first representative distance. The display device further includes a filter coupled with the display panel for transmitting light projected by the display panel through the filter. The filter has a first filter region configured to change a direction of at least a portion of light emitted by the plurality of light emitters in the first emission region, and a second filter region that is mutually exclusive to the first filter region and configured to change a direction of at least a portion of light emitted by the plurality of light emitters in the second emission region. The first filter region is configured to cause a first distribution of light emitted from a first light emitter of the two light emitters in the first emission region and a second distribution of light emitted from a second light emitter of the two light emitters in the first emission region so that the first distribution at least partially overlaps with the second distribution. The second filter region is configured to cause a third distribution of light emitted from a first light emitter of the two light emitters in the second emission region and a fourth distribution of light emitted from a second light emitter of the two light emitters in the second emission region so that the third distribution at least partially overlaps with the fourth distribution.

In accordance with some embodiments, a method includes causing, with a first filter region of an optical filter, distribution of light impinging on the first filter region in a first manner so that light from two emitters having a first distance between the two emitters with a gap between the two emitters appears to be emitted from two emitters positioned without a gap between the two emitters; and causing, with a second filter region of the optical filter, distribution of light impinging on the second filter region in a second manner that is distinct form the first manner so that light from two emitters having a second distance that is different from the first distance between the two emitters with a gap between the two emitters appears to be emitted from two emitters positioned without a gap between the two emitters.

In accordance with some embodiments, a method for processing light projected by a display panel having a first emission region and a second emission region that is mutually exclusive to the first emission region and surrounds the first emission region, the method includes causing, with a first filter region configured to change a direction of at least a portion of light emitted by a plurality of light emitters arranged in the first emission region, a first distribution of light emitted from a first light emitter of two light emitters of the plurality of light emitters in the first emission region and a second distribution of light emitted from a second light emitter of the two light emitters of the plurality of light emitters in the first emission region so that the first distribution at least partially overlaps with the second distribution. The two light emitters, that are adjacent to each other, in the first emission region are spaced apart from each other by a first representative distance. The method further includes causing, with a second filter region configured to change a direction of at least a portion of light emitted by a plurality of light emitters arranged in the second emission region, a third distribution of light emitted from a first light emitter of two light emitters of the plurality of light emitters in the second emission region and a fourth distribution of light emitted from a second light emitter of the two light emitters of the plurality of light emitters in the second emission region so that the third distribution at least partially overlaps with the fourth distribution. The two light emitters, that are adjacent to each other, in the second emission region are spaced apart from each other by a second representative distance that is greater than the first representative distance.

In accordance with some embodiments, a head-mounted-display device includes one or more lenses, a display panel coupled with the one or more lenses for projecting light toward one or more eyes of a wearer through the one or more lenses, and a filter coupled with the display panel for transmitting light projected by the display panel through the filter. The display panel includes a plurality of light emitters in a first emission region of the display panel, and a plurality of light emitters in a second emission region of the display panel that is distinct from and mutually exclusive to the first emission region and surrounds the first emission region. Two light emitters, that are adjacent to each other, in the first emission region are spaced apart from each other by a first representative distance, and two light emitters, that are adjacent to each other, in the second emission region are spaced apart from each other by a second representative distance that is greater than the first representative distance. The filter has a first filter region configured to change a direction of at least a portion of light emitted by the plurality of light emitters in the first emission region, and a second filter region that is mutually exclusive to the first filter region and configured to change a direction of at least a portion of light emitted by the plurality of light emitters in the second emission region. The first filter region is configured to cause a first distribution of light emitted from a first light emitter of the two light emitters in the first emission region and a second distribution of light emitted from a second light emitter of the two light emitters in the first emission region so that the first distribution at least partially overlaps with the second distribution. The second filter region is configured to cause a third distribution of light emitted from a first light emitter of the two light emitters in the second emission region and a fourth distribution of light emitted from a second light emitter of the two light emitters in the second emission region so that the third distribution at least partially overlaps with the fourth distribution.

Thus, the disclosed embodiments provide devices and methods that reduce the screen-door effect.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIGS. 12A-12D show example filters and patterns of light transmitted therethrough in accordance with some embodiments.

FIGS. 13A-13C show example filters and patterns of light transmitted therethrough in accordance with some embodiments.

FIG. 14 is a flow diagram illustrating a method for processing light projected by a display panel in accordance with some embodiments.

Figure 1:
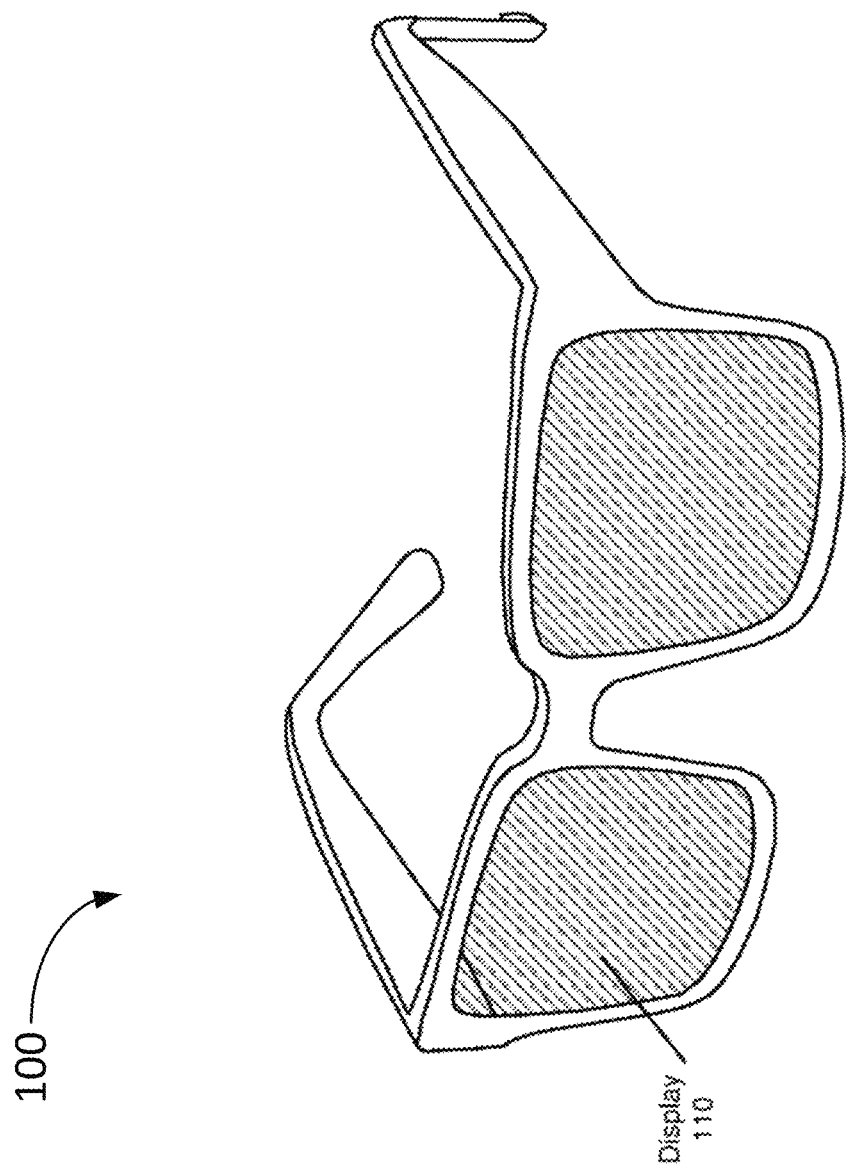
FIG. 1 is a perspective view of a display device in accordance with some embodiments.

These figures are not drawn to scale unless indicated otherwise.

DETAILED DESCRIPTION

Human eyes have a non-uniform resolution across a field of vision. For example, a human eye typically has a high resolution around a fovea of the eye, and the resolution rapidly decreases toward a peripheral area of a retina of the eye. To reduce the power consumption of head-mounted display devices, foveated displays with multiple emission regions of different densities are used.

However, due to the practical limitations on the display resolution, the user can see the gap between light emitters arranged in such displays. This "screen-door effect" is especially significant for a low density region of a foveated display, as light emitters in the low density region are spaced apart from each other than light emitters in a high density region of the foveated display.

A filter having multiple filter regions is used for reducing the screen-door effect. Each filter region is configured to reduce the screen-door effect from a corresponding emission region of the foveated display. Thus, the filter does not reduce the display resolution. This, in turn, enhances the user experience with head-mounted display devices.

Reference will now be made to embodiments, examples of which are illustrated in the accompanying drawings. In the following description, numerous specific details are set forth in order to provide an understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first region could be termed a second region, and, similarly, a second region could be termed a first region, without departing from the scope of the various described embodiments. The first region and the second region are both regions, but they are not the same region.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Embodiments described herein may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1 illustrates display device 100 in accordance with some embodiments. In some embodiments, display device 100 is configured to be worn on a head of a user (e.g., by having the form of spectacles or eyeglasses, as shown in FIG. 1) or to be included as part of a helmet that is to be worn by the user. When display device 100 is configured to be worn on a head of a user or to be included as part of a helmet, display device 100 is called a head-mounted display. Alternatively, display device 100 is configured for placement in proximity of an eye or eyes of the user at a fixed location, without being head-mounted (e.g., display device 100 is mounted in a vehicle, such as a car or an airplane, for placement in front of an eye or eyes of the user). As shown in FIG. 1, display device 100 includes display 110. Display 110 is configured for presenting visual contents (e.g., augmented reality contents, virtual reality contents, mixed reality contents, or any combination thereof) to a user.

In some embodiments, display device 100 includes one or more components described below with respect to FIG. 2. In some embodiments, display device 100 includes additional components not shown in FIG. 2.

Figure 2:
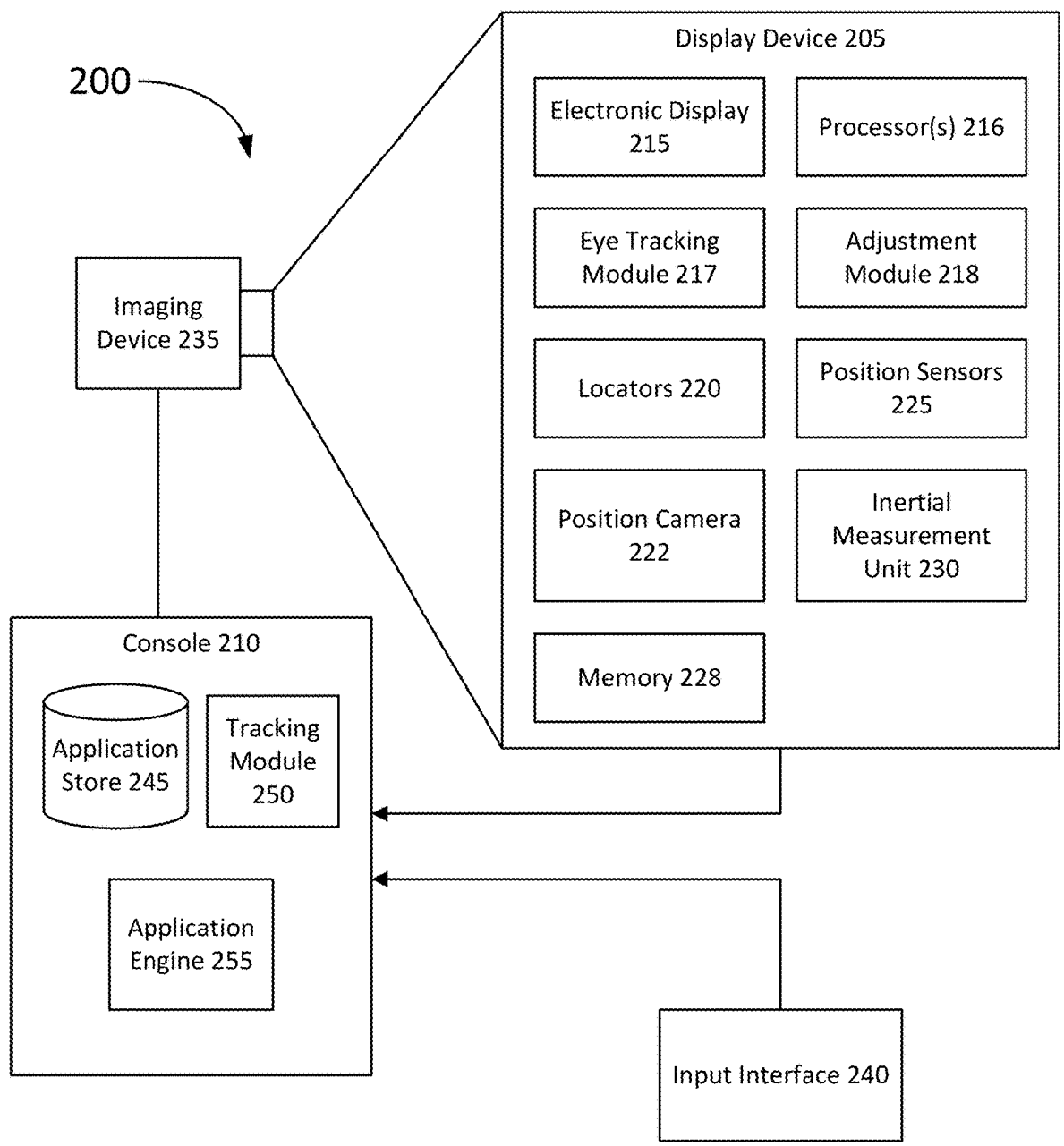
FIG. 2 is a block diagram of a system including a display device in accordance with some embodiments.

FIG. 2 is a block diagram of system 200 in accordance with some embodiments. The system 200 shown in FIG. 2 includes display device 205 (which corresponds to display device 100 shown in FIG. 1), imaging device 235, and input interface 240 that are each coupled to console 210. While FIG. 2 shows an example of system 200 including one display device 205, imaging device 235, and input interface 240, in other embodiments, any number of these components may be included in system 200. For example, there may be multiple display devices 205 each having associated input interface 240 and being monitored by one or more imaging devices 235, with each display device 205, input interface 240, and imaging devices 235 communicating with console 210. In alternative configurations, different and/or additional components may be included in system 200. For example, in some embodiments, console 210 is connected via a network (e.g., the Internet) to system 200 or is self-contained as part of display device 205 (e.g., physically located inside display device 205). In some embodiments, display device 205 is used to create mixed reality by adding in a view of the real surroundings. Thus, display device 205 and system 200 described here can deliver virtual reality, mixed reality, and augmented reality.

In some embodiments, as shown in FIG. 1, display device 205 is a head-mounted display that presents media to a user. Examples of media presented by display device 205 include one or more images, video, audio, or some combination thereof. In some embodiments, audio is presented via an external device (e.g., speakers and/or headphones) that receives audio information from display device 205, console 210, or both, and presents audio data based on the audio information. In some embodiments, display device 205 immerses a user in a virtual environment.

In some embodiments, display device 205 also acts as an augmented reality (AR) headset. In these embodiments, display device 205 augments views of a physical, real-world environment with computer-generated elements (e.g., images, video, sound, etc.). Moreover, in some embodiments, display device 205 is able to cycle between different types of operation. Thus, display device 205 operate as a virtual reality (VR) device, an AR device, as glasses or some combination thereof (e.g., glasses with no optical correction, glasses optically corrected for the user, sunglasses, or some combination thereof) based on instructions from application engine 255.

Display device 205 includes electronic display 215, one or more processors 216, eye tracking module 217, adjustment module 218, one or more locators 220, one or more position sensors 225, one or more position cameras 222, memory 228, inertial measurement unit (IMU) 230, or a subset or superset thereof (e.g., display device 205 with electronic display 215, one or more processors 216, and memory 228, without any other listed components). Some embodiments of display device 205 have different modules than those described here. Similarly, the functions can be distributed among the modules in a different manner than is described here.

One or more processors 216 (e.g., processing units or cores) execute instructions stored in memory 228. Memory 228 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 228, or alternately the non-volatile memory device(s) within memory 228, includes a non-transitory computer readable storage medium. In some embodiments, memory 228 or the computer readable storage medium of memory 228 stores programs, modules and data structures, and/or instructions for displaying one or more images on electronic display 215.

Electronic display 215 displays images to the user in accordance with data received from console 210 and/or processor(s) 216. In various embodiments, electronic display 215 may comprise a single adjustable electronic display element or multiple adjustable electronic displays elements (e.g., a display for each eye of a user).

In some embodiments, the display element includes one or more light emission devices and a corresponding array of emission intensity array. An emission intensity array is an array of electro-optic pixels, opto-electronic pixels, some other array of devices that dynamically adjust the amount of light transmitted by each device, or some combination thereof. These pixels are placed behind one or more lenses. In some embodiments, the emission intensity array is an array of liquid crystal based pixels in an LCD (a Liquid Crystal Display). Examples of the light emission devices include: an organic light emitting diode, an active-matrix organic light-emitting diode, a light emitting diode, some type of device capable of being placed in a flexible display, or some combination thereof. The light emission devices include devices that are capable of generating visible light (e.g., red, green, blue, etc.) used for image generation. The emission intensity array is configured to selectively attenuate individual light emission devices, groups of light emission devices, or some combination thereof. Alternatively, when the light emission devices are configured to selectively attenuate individual emission devices and/or groups of light emission devices, the display element includes an array of such light emission devices without a separate emission intensity array.

One or more lenses direct light from the arrays of light emission devices (optionally through the emission intensity arrays) to locations within each eyebox and ultimately to the back of the user's retina(s). An eyebox is a region that is occupied by an eye of a user located proximity to display device 205 (e.g., a user wearing display device 205) for viewing images from display device 205. In some cases, the eyebox is represented as a 10 mm×10 mm square. In some embodiments, the one or more lenses include one or more coatings, such as anti-reflective coatings.

In some embodiments, the display element includes an infrared (IR) detector array that detects IR light that is retro-reflected from the retinas of a viewing user, from the surface of the corneas, lenses of the eyes, or some combination thereof. The IR detector array includes an IR sensor or a plurality of IR sensors that each correspond to a different position of a pupil of the viewing user's eye. In alternate embodiments, other eye tracking systems may also be employed.

Eye tracking module 217 determines locations of each pupil of a user's eyes. In some embodiments, eye tracking module 217 instructs electronic display 215 to illuminate the eyebox with IR light (e.g., via IR emission devices in the display element).

A portion of the emitted IR light will pass through the viewing user's pupil and be retro-reflected from the retina toward the IR detector array, which is used for determining the location of the pupil. Alternatively, the reflection off of the surfaces of the eye is used to also determine location of the pupil. The IR detector array scans for retro-reflection and identifies which IR emission devices are active when retro-reflection is detected. Eye tracking module 217 may use a tracking lookup table and the identified IR emission devices to determine the pupil locations for each eye. The tracking lookup table maps received signals on the IR detector array to locations (corresponding to pupil locations) in each eyebox. In some embodiments, the tracking lookup table is generated via a calibration procedure (e.g., user looks at various known reference points in an image and eye tracking module 217 maps the locations of the user's pupil while looking at the reference points to corresponding signals received on the IR tracking array). Alternatively, the eye's gaze direction may be calculated using the known geometry of the system and the eye, by calibration of the system, or by machine learning techniques. As mentioned above, in some embodiments, system 200 may use other eye tracking systems than the embedded IR one described above.

Adjustment module 218 generates an image frame based on the determined locations of the pupils. In some embodiments, this sends a discrete image to the display that will tile subimages together thus a coherent stitched image will appear on the back of the retina. Adjustment module 218 adjusts an output (i.e. the generated image frame) of electronic display 215 based on the detected locations of the pupils. Adjustment module 218 instructs portions of electronic display 215 to pass image light to the determined locations of the pupils. In some embodiments, adjustment module 218 also instructs the electronic display to not pass image light to positions other than the determined locations of the pupils. Adjustment module 218 may, for example, block and/or stop light emission devices whose image light falls outside of the determined pupil locations, allow other light emission devices to emit image light that falls within the determined pupil locations, translate and/or rotate one or more display elements, dynamically adjust curvature and/or refractive power of one or more active lenses in the lens (e.g., microlens) arrays, or some combination thereof.

Optional locators 220 are objects located in specific positions on display device 205 relative to one another and relative to a specific reference point on display device 205. A locator 220 may be a light emitting diode (LED), a corner cube reflector, a reflective marker, a type of light source that contrasts with an environment in which display device 205 operates, or some combination thereof. In embodiments where locators 220 are active (i.e., an LED or other type of light emitting device), locators 220 may emit light in the visible band (e.g., about 400 nm to 750 nm), in the infrared band (e.g., about 750 nm to 1 mm), in the ultraviolet band (about 100 nm to 400 nm), some other portion of the electromagnetic spectrum, or some combination thereof.

In some embodiments, locators 220 are located beneath an outer surface of display device 205, which is transparent to the wavelengths of light emitted or reflected by locators 220 or is thin enough to not substantially attenuate the wavelengths of light emitted or reflected by locators 220. Additionally, in some embodiments, the outer surface or other portions of display device 205 are opaque in the visible band of wavelengths of light. Thus, locators 220 may emit light in the IR band under an outer surface that is transparent in the IR band but opaque in the visible band.

IMU 230 is an electronic device that generates calibration data based on measurement signals received from one or more position sensors 225. Position sensor 225 generates one or more measurement signals in response to motion of display device 205. Examples of position sensors 225 include: one or more accelerometers, one or more gyroscopes, one or more magnetometers, another suitable type of sensor that detects motion, a type of sensor used for error correction of IMU 230, or some combination thereof. Position sensors 225 may be located external to IMU 230, internal to IMU 230, or some combination thereof.

Based on the one or more measurement signals from one or more position sensors 225, IMU 230 generates first calibration data indicating an estimated position of display device 205 relative to an initial position of display device 205. For example, position sensors 225 include multiple accelerometers to measure translational motion (forward/back, up/down, left/right) and multiple gyroscopes to measure rotational motion (e.g., pitch, yaw, roll). In some embodiments, IMU 230 rapidly samples the measurement signals and calculates the estimated position of display device 205 from the sampled data. For example, IMU 230 integrates the measurement signals received from the accelerometers over time to estimate a velocity vector and integrates the velocity vector over time to determine an estimated position of a reference point on display device 205. Alternatively, IMU 230 provides the sampled measurement signals to console 210, which determines the first calibration data. The reference point is a point that may be used to describe the position of display device 205. While the reference point may generally be defined as a point in space; however, in practice the reference point is defined as a point within display device 205 (e.g., a center of IMU 230).

In some embodiments, IMU 230 receives one or more calibration parameters from console 210. As further discussed below, the one or more calibration parameters are used to maintain tracking of display device 205. Based on a received calibration parameter, IMU 230 may adjust one or more IMU parameters (e.g., sample rate). In some embodiments, certain calibration parameters cause IMU 230 to update an initial position of the reference point so it corresponds to a next calibrated position of the reference point. Updating the initial position of the reference point as the next calibrated position of the reference point helps reduce accumulated error associated with the determined estimated position. The accumulated error, also referred to as drift error, causes the estimated position of the reference point to "drift" away from the actual position of the reference point over time.

Imaging device 235 generates calibration data in accordance with calibration parameters received from console 210. Calibration data includes one or more images showing observed positions of locators 220 that are detectable by imaging device 235. In some embodiments, imaging device 235 includes one or more still cameras, one or more video cameras, any other device capable of capturing images including one or more locators 220, or some combination thereof. Additionally, imaging device 235 may include one or more filters (e.g., used to increase signal to noise ratio). Imaging device 235 is configured to optionally detect light emitted or reflected from locators 220 in a field of view of imaging device 235. In embodiments where locators 220 include passive elements (e.g., a retroreflector), imaging device 235 may include a light source that illuminates some or all of locators 220, which retro-reflect the light towards the light source in imaging device 235. Second calibration data is communicated from imaging device 235 to console 210, and imaging device 235 receives one or more calibration parameters from console 210 to adjust one or more imaging parameters (e.g., focal length, focus, frame rate, ISO, sensor temperature, shutter speed, aperture, etc.).

Input interface 240 is a device that allows a user to send action requests to console 210. An action request is a request to perform a particular action. For example, an action request may be to start or end an application or to perform a particular action within the application. Input interface 240 may include one or more input devices. Example input devices include: a keyboard, a mouse, a game controller, data from brain signals, data from other parts of the human body, or any other suitable device for receiving action requests and communicating the received action requests to console 210. An action request received by input interface 240 is communicated to console 210, which performs an action corresponding to the action request. In some embodiments, input interface 240 may provide haptic feedback to the user in accordance with instructions received from console 210. For example, haptic feedback is provided when an action request is received, or console 210 communicates instructions to input interface 240 causing input interface 240 to generate haptic feedback when console 210 performs an action.

Console 210 provides media to display device 205 for presentation to the user in accordance with information received from one or more of: imaging device 235, display device 205, and input interface 240. In the example shown in FIG. 2, console 210 includes application store 245, tracking module 250, and application engine 255. Some embodiments of console 210 have different modules than those described in conjunction with FIG. 2. Similarly, the functions further described below may be distributed among components of console 210 in a different manner than is described here.

When application store 245 is included in console 210, application store 245 stores one or more applications for execution by console 210. An application is a group of instructions, that when executed by a processor, is used for generating content for presentation to the user. Content generated by the processor based on an application may be in response to inputs received from the user via movement of display device 205 or input interface 240. Examples of applications include: gaming applications, conferencing applications, video playback application, or other suitable applications.

When tracking module 250 is included in console 210, tracking module 250 calibrates system 200 using one or more calibration parameters and may adjust one or more calibration parameters to reduce error in determination of the position of display device 205. For example, tracking module 250 adjusts the focus of imaging device 235 to obtain a more accurate position for observed locators on display device 205. Moreover, calibration performed by tracking module 250 also accounts for information received from IMU 230. Additionally, if tracking of display device 205 is lost (e.g., imaging device 235 loses line of sight of at least a threshold number of locators 220), tracking module 250 re-calibrates some or all of system 200.

In some embodiments, tracking module 250 tracks movements of display device 205 using second calibration data from imaging device 235. For example, tracking module 250 determines positions of a reference point of display device 205 using observed locators from the second calibration data and a model of display device 205. In some embodiments, tracking module 250 also determines positions of a reference point of display device 205 using position information from the first calibration data. Additionally, in some embodiments, tracking module 250 may use portions of the first calibration data, the second calibration data, or some combination thereof, to predict a future location of display device 205. Tracking module 250 provides the estimated or predicted future position of display device 205 to application engine 255.

Application engine 255 executes applications within system 200 and receives position information, acceleration information, velocity information, predicted future positions, or some combination thereof of display device 205 from tracking module 250. Based on the received information, application engine 255 determines content to provide to display device 205 for presentation to the user. For example, if the received information indicates that the user has looked to the left, application engine 255 generates content for display device 205 that mirrors the user's movement in a virtual environment. Additionally, application engine 255 performs an action within an application executing on console 210 in response to an action request received from input interface 240 and provides feedback to the user that the action was performed. The provided feedback may be visual or audible feedback via display device 205 or haptic feedback via input interface 240.

Figure 3:
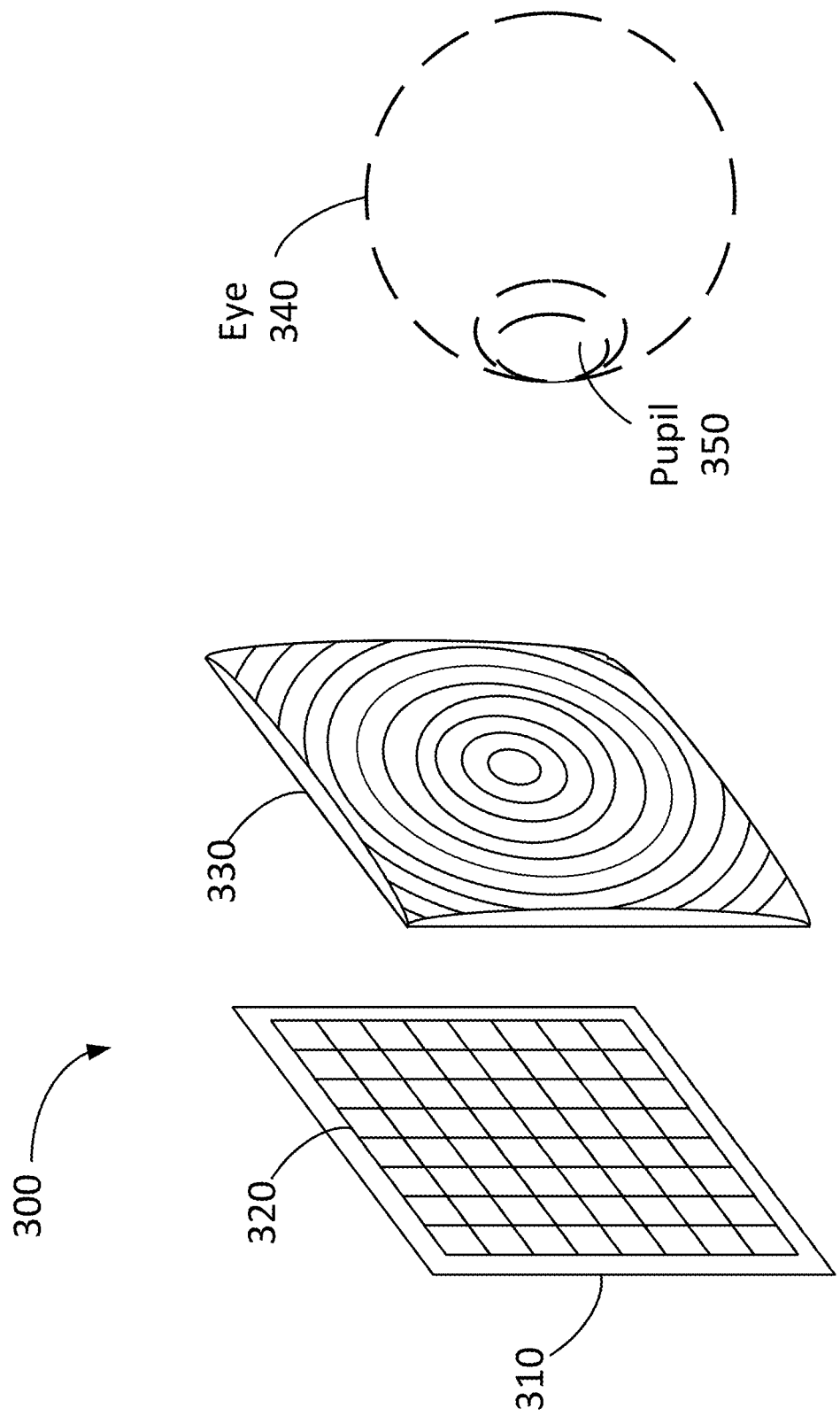
FIG. 3 is an isometric view of a display device in accordance with some embodiments.

FIG. 3 is an isometric view of display device 300 in accordance with some embodiments. In some other embodiments, display device 300 is part of some other electronic display (e.g., digital microscope, etc.). In some embodiments, display device 300 includes light emission device array 310 and one or more lenses 330. In some embodiments, display device 300 also includes an emission intensity array and an IR detector array.

Light emission device array 310 emits image light and optional IR light toward the viewing user. Light emission device array 310 may be, e.g., an array of LEDs, an array of microLEDs, an array of OLEDs, or some combination thereof. Light emission device array 310 includes light emission devices 320 that emit light in the visible light (and optionally includes devices that emit light in the IR). In some embodiments, a microLED includes an LED with an emission area characterized by a representative dimension (e.g., a diameter, a width, a height, etc.) of 100 µm or less (e.g., 50 µm, 20 µm, etc.). In some embodiments, a microLED has an emission area having a shape of a circle or a rectangle.

The emission intensity array is configured to selectively attenuate light emitted from light emission array 310. In some embodiments, the emission intensity array is composed of a plurality of liquid crystal cells or pixels, groups of light emission devices, or some combination thereof. Each of the liquid crystal cells is, or in some embodiments, groups of liquid crystal cells are, addressable to have specific levels of attenuation. For example, at a given time, some of the liquid crystal cells may be set to no attenuation, while other liquid crystal cells may be set to maximum attenuation. In this manner the emission intensity array is able to control what portion of the image light emitted from light emission device array 310 is passed to the one or more lenses 330. In some embodiments, display device 300 uses the emission intensity array to facilitate providing image light to a location of pupil 350 of eye 340 of a user, and minimize the amount of image light provided to other areas in the eyebox.

One or more lenses 330 receive the modified image light (e.g., attenuated light) from the emission intensity array (or directly from emission device array 310), and shifted by one or more beam shifters 360, and direct the shifted image light to a location of pupil 350.

An optional IR detector array detects IR light that has been retro-reflected from the retina of eye 340, a cornea of eye 340, a crystalline lens of eye 340, or some combination thereof. The IR detector array includes either a single IR sensor or a plurality of IR sensitive detectors (e.g., photodiodes). In some embodiments, the IR detector array is separate from light emission device array 310. In some embodiments, the IR detector array is integrated into light emission device array 310.

In some embodiments, light emission device array 310 and the emission intensity array make up a display element. Alternatively, the display element includes light emission device array 310 (e.g., when light emission device array 310 includes individually adjustable pixels) without the emission intensity array. In some embodiments, the display element additionally includes the IR array. In some embodiments, in response to a determined location of pupil 350, the display element adjusts the emitted image light such that the light output by the display element is refracted by one or more lenses 330 toward the determined location of pupil 350, and not toward other locations in the eyebox.

A significant portion of power used for operating a head-mounted display device is used for (i) computation needed to render high-resolution images and (ii) conversion of electrical energy to light for displaying the rendered images. Human eyes have a non-uniform resolution across a field of vision. For example, a human eye typically has a high resolution around a fovea of the eye, and the resolution rapidly decreases toward a peripheral area of a retina of the eye. To reduce the power consumption of head-mounted display devices, displays with multiple regions of different densities are used. A high resolution region is used for providing a high resolution image to the fovea of the eye, and a low resolution region is used for providing a low resolution image to the peripheral area of the retina of the eye (which, however, does not impact the perceived resolution, as the peripheral area of the retina of the eye has a low resolution). The low resolution region consumes less power than the high resolution region for a same unit area.

Figure 4:
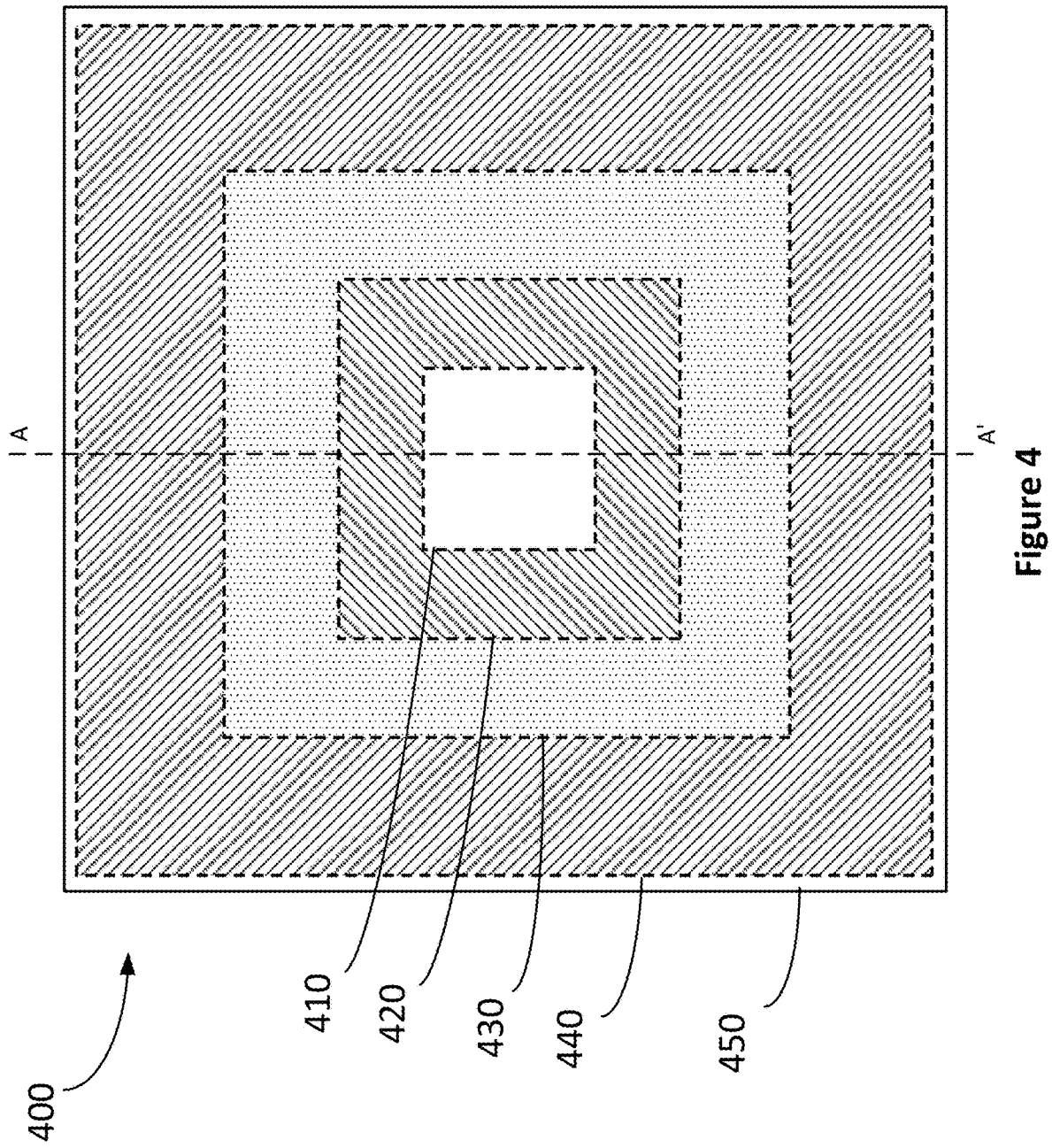
FIG. 4 illustrates a display panel in accordance with some embodiments.

FIG. 4 illustrates a display panel 400 in accordance with some embodiments.

In some embodiments, the display panel 400 corresponds to the light emission device array 310 shown in FIG. 3. In some embodiments, the display panel 400 is coupled with a circuit board 450. The display panel 400 includes a first emission region 410, a second emission region 420, a third emission region 430, and a fourth emission region 440. Although FIG. 4 illustrates the display panel 400 having four emission regions, the display panel 400 is not limited to having four emission regions, but rather may have fewer or more emission regions (e.g., at least 2, 3, 5, 6, or 7 regions, etc.).

In some cases, the first emission region 410 is configured to provide light to a fovea of a user's eye and the other emission regions (e.g., the second emission region 420, the third emission region 430, and the fourth emission region 440) is configured to provide light to a peripheral-vision area of the user's eye. The second emission region 420 is distinct from and mutually exclusive to the first emission region 410 and the third emission region 430 is distinct from and mutually exclusive to the second emission region 420. The fourth emission region 440 is distinct from and mutually exclusive to the third emission region 430.

In FIG. 4, the first emission region 410 is surrounded by the second emission region 420, the second emission region 420 is surrounded by the third emission region 430 and the third emission region 430 is surrounded by the fourth emission region 440.

In some embodiments, the first emission region 410 is no more than 50% of the total area of the display panel 400, less than 20%, less than 10%, and less than 5% of the area of the display panel 400.

In some embodiments, the second emission region 420 is in contact with the first emission region 410, and the third emission region 430 is in contact with the second emission region 420. In some embodiments, the fourth emission region 440 is in contact with the third emission region 430.

In some embodiments, the third emission region 430 is distinct and separate from the first emission region 410. In some embodiments, the fourth emission region 440 is distinct and separate from the first emission region 410 and the second emission region 420.

In some embodiments, the display panel 400 includes a plurality of light emitters arranged in the first emission region 410, the second emission region 420, the third emission region 430, and the fourth emission region 440 (e.g., multiple light emitters are arranged in the first emission region 410, multiple light emitters are arranged in the second emission region 420, multiple light emitters are arranged in the third emission region 430, and multiple light emitters are arranged in the fourth emission region 440).

In some embodiments, the plurality of light emitters is individually addressable. In some embodiments, the light emitters are arranged in a respective emission region in an array (e.g., a rectangular array, a honeycomb array, etc.). In order to provide different resolutions in different emission regions, each emission region has a different density of light emitters. In some embodiments, the first emission region 410 has a first density of light emitters, the second emission region 420 has a second density of light emitters that is less than the first density, and the third emission region 430 has a third density of light emitters that is less than the second density. In some embodiments, the fourth emission region 440 has a fourth density of light emitters that is less than the third density.

In some embodiments, the first density is at least 50% higher than the second density. In some embodiments, the first density is at least 75% higher than the second density. In some embodiments, the first density is at least 100% higher than the second density.

In some embodiments, the second density is at least 50% higher than the third density. In some embodiments, the second density is at least 75% higher than the third density. In some embodiments, the second density is at least 100% higher than the third density.

In some embodiments, the third density is at least 50% higher than the fourth density. In some embodiments, the third density is at least 75% higher than the fourth density.

In some embodiments, the third density is at least 100% higher than the fourth density.

In some embodiments, for any pair of emission regions selected from the plurality of emission regions in the display panel, an inner emission region of the pair of emission regions has a density of light emitters that is higher than a density of light emitters of an outer emission region of the pair of emission regions, the inner emission region being surrounded by the outer emission region.

In some embodiments, a ratio of the first density to the fourth density is at least 1.5, at least 2:1, at least 5:1, or at least 10:1. In some embodiments, a ratio of the first density to the third density is at least 1.5, at least 2:1, at least 5:1, or at least 10:1.

In some embodiments, a resolution of the display panel 400 decreases gradually from at least one emission region of the display panel to another. For example, in some cases, the first density of the first emission region 410 has the highest resolution among the plurality of emission regions, the second density of the second emission region 420 is at least 80%, 90%, or 95% of the first density, and the third density of the third emission region 430 is at least 80%, 90%, or 95% of the second density. In some embodiments, the fourth density of the fourth emission region 440 is at least 80%, 90%, or 95% of the third density.

In some embodiments, the display panel 400 includes ten or more emission regions, for any pair of adjacent emission regions selected from the ten or more emission regions, an outer emission region of the pair of adjacent emission regions has a density of light emitters that is at least 80%, 90%, or 95% of a density of light emitters of an inner emission region of the pair of adjacent emission regions. In some embodiments, the densities of the emission regions are selected so that boundaries of the emission regions are not visually perceivable (e.g., a ratio of densities of two adjacent emission regions is less than a predefined threshold).

Figure 5:
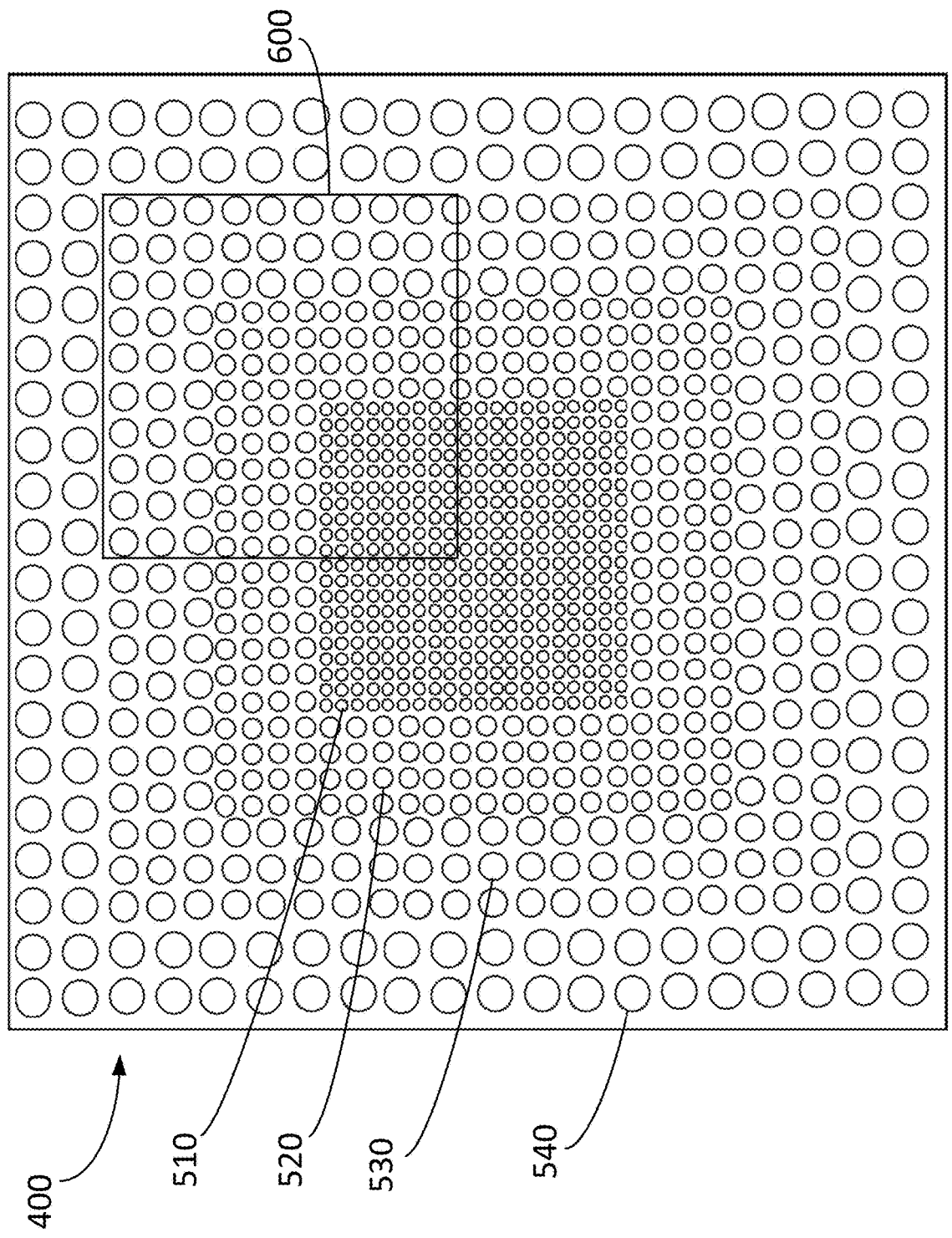
FIG. 5 illustrates a plurality of light emitters located in a plurality of emission regions of a display panel in accordance with some embodiments.

FIG. 5 illustrates a plurality of light emitters located in a plurality of emission regions in a display panel (e.g., the display panel 400 shown in FIG. 4) in accordance with some embodiments.

As shown in FIG. 5, light emitters are arranged with a different density in each of the first, second, third, and fourth emission regions of the display panel 400. Light emitters 510 are arranged in the first emission region, light emitters 520 are arranged in the second emission region, and light emitters 530 are arranged in the third emission region. Light emitters 540 are arranged in the fourth emission region.

As shown in FIG. 5, in some embodiments, a light emitter 510 in the first emission region is smaller than a light emitter 520 in the second emission region, a light emitter 530 in the third emission region, and a light emitter 540 in the fourth emission region. In some embodiments, the light emitter 520 in the second emission region is smaller than the light emitter 530 in the third emission region and the light emitter 540 in the fourth emission region. In some embodiments, the light emitter 530 in the third emission region is smaller than the light emitter 540 in the fourth emission region.

In some embodiments, each of the plurality of emitters has a same emission area.

In some embodiments, an emission area of an emitter increases with the reduction in a density of the plurality of emission regions, thereby maintaining a perceived brightness uniformly across the field of view. In some embodiments, for any pair of emission regions in the display panel 400, a light emitter in the inner emission region of the pair of emission regions has an emission area that is smaller than an emission area of a light emitter in the outer emission region surrounding the inner region while the inner emission region has a higher density than the outer emission region. For example, as shown in FIG. 5, in some embodiments, the first emission region has a higher density than the second emission region, and the light emitter 510 in the first emission region have an emission area that is less than an emission area of the light emitter 520 in the second emission region. In some embodiments, the emission area of the light emitter 520 in the second emission region is less than an emission area of the light emitter 530 in the third emission region. In some embodiments, the emission area of the light emitter 530 in the third emission region is less than an emission area of the light emitter 540 in the fourth emission region. In some embodiments, the emission area of the light emitter 510 in the first emission region is less than 50%, 20%, 10%, or 5% of the emission area of the light emitter 540 in the fourth emission region. In some embodiments, the emission area of the light emitter 510 in the first emission region is less than 50%, 20%, 10%, or 5% of the emission area of the light emitter 530 in the third emission region.

The plurality of light emitters in accordance with some embodiments is based on organic light-emitting diodes (OLEDs), light-emitting diodes (LEDs), superluminescent LEDs (SLEDs), LD, or vertical cavity surface emitting lasers (VCSELs), or any combination thereof. The display device in accordance with some embodiments is monochromatic, or has two, three (e.g. RGB), or four colors (e.g. RGBY or RGBW), or more. In some embodiments, the display device is a combination of color emitters with IR emitters. In some embodiments, the display device is a combination of color emitters with at least one of: IR emitters and UV emitters. In some embodiments, a respective light emitter of the plurality of light emitters includes a first sub-pixel corresponding to a first color (e.g., red) and a second sub-pixel, that is distinct from the first sub-pixel, corresponding to a second color (e.g., blue) that is distinct from the first color. In some embodiments, the respective light emitter includes a third sub-pixel, that is distinct from the first sub-pixel and the second sub-pixel, corresponding to a third color (e.g., green) that is distinct from the first color and the second color.

As described above, in some embodiments, each emission region has a different density of light emitters. A box illustrated in FIG. 5 indicates a portion 600 of the display panel 400 that is shown in detail in FIG. 6.

Figure 6:
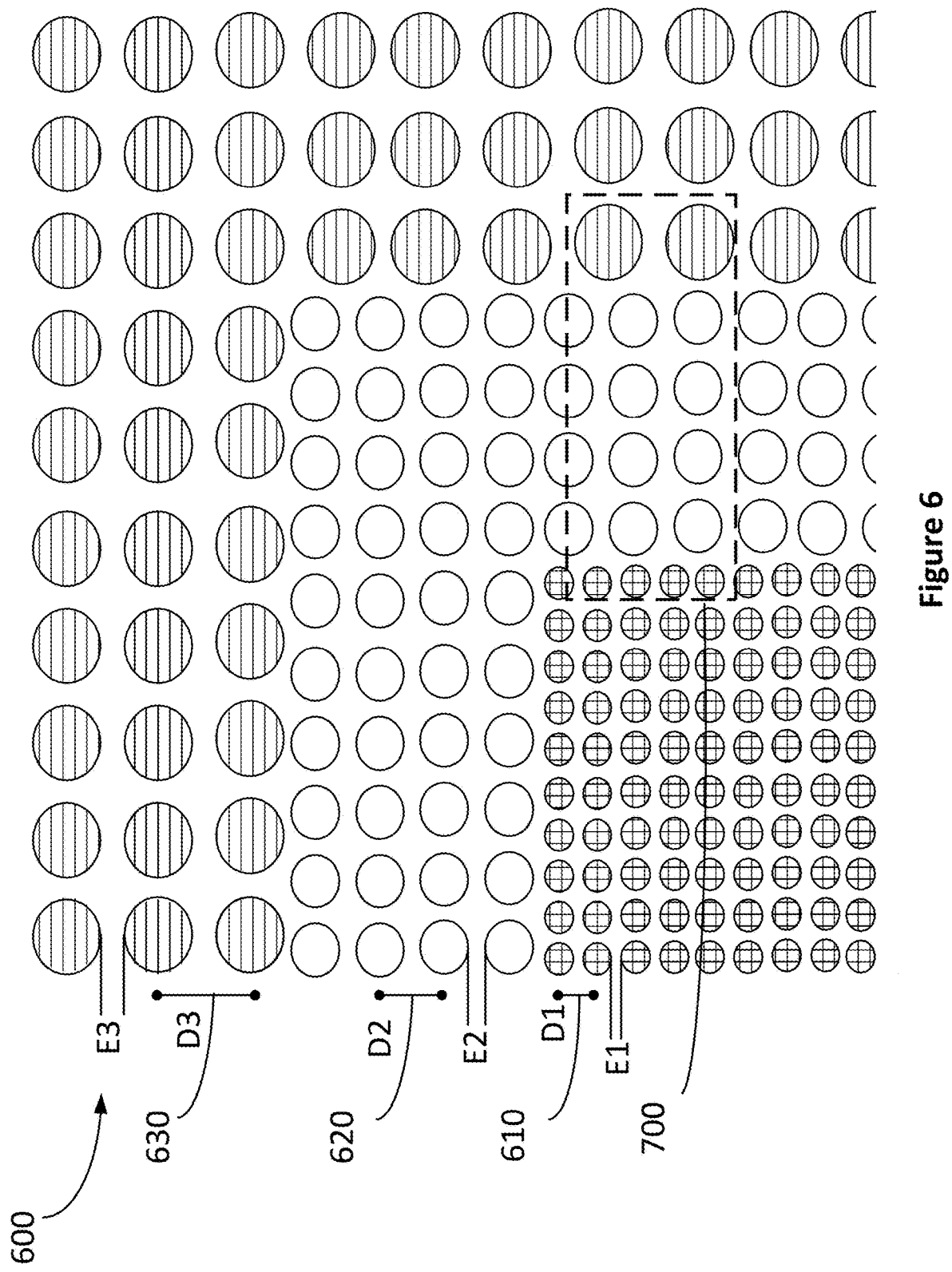
FIG. 6 illustrates an enlarged view of a portion of the display panel shown in FIG. 5 in accordance with some embodiments.

FIG. 6 illustrates an enlarged view of a portion 600 of the display panel 400 shown in FIG. 5 in accordance with some embodiments. The portion 600 shows different densities of light emitters in the first emission region, the second emission region, and the third emission region in accordance with some embodiments.

In FIG. 6, the portion 600 of the display panel 400 includes a portion of the first emission region, a portion of the second emission region, and a portion of the third emission region. For illustration purposes, in FIG. 6, light emitters in the first emission region, the second emission region, and the third emission region are filled with different hatching patterns (e.g., the light emitters in the first emission region are cross-hatched, the light emitters in the second emission region are not hatched, and the light emitters in the third emission region are horizontally hatched).

In some embodiments, a density of light emitters in an emission region is determined from a distance between adjacent (e.g., neighboring) light emitters in the emission region. In some cases, a center-to-center spacing between the adjacent light emitters is deemed to be the distance between the adjacent light emitters. In some cases, an average center-to-center spacing between adjacent light emitters in a particular emission region is deemed to be the distance between the adjacent light emitters. In some cases, an edge-to-edge spacing between the adjacent light emitters is deemed to be the distance between the adjacent light emitters. As shown in FIG. 6, two light emitters, that are adjacent to each other, in the first emission region are spaced apart by a first distance 610 (e.g., a first center-to-center distance D1 or a first edge-to-edge distance E1) and two light emitters, that are adjacent to each other, in the second emission region are spaced apart by a second distance 620 (e.g., a second center-to-center distance D2 or a second edge-to-edge distance E2) that is greater than the first distance 610. Two light emitters, that are adjacent to each other, in the third emission region are spaced apart by a third distance 630 (e.g., a third center-to-center distance D3 or a third edge-to-edge distance E3) that is greater than the second distance 620. As shown in FIG. 6, the first emission region has a higher density of light emitters than the second emission region, and the second emission region has a higher density of light emitters than the third emission region.

Figure 7:
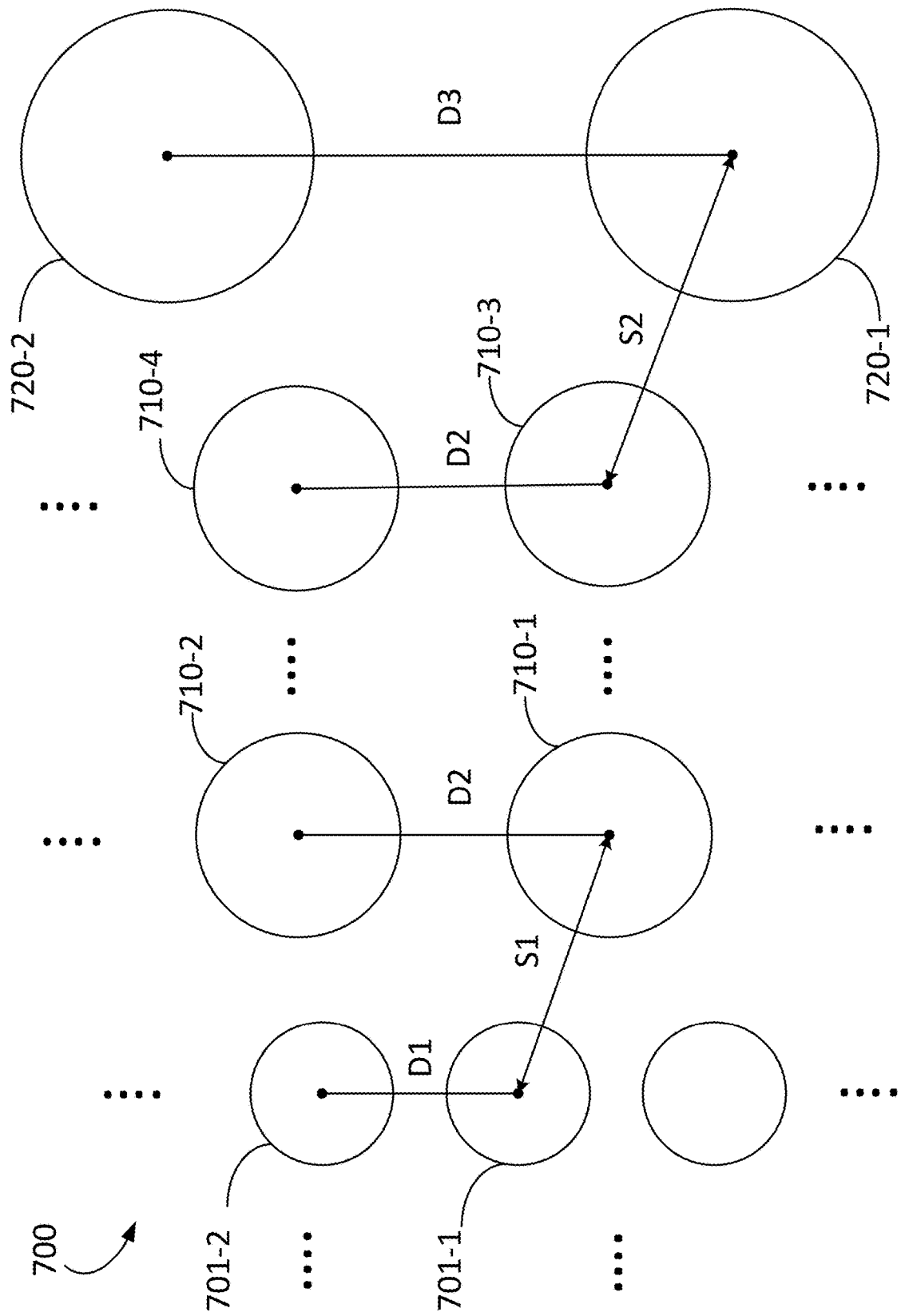
FIG. 7 illustrates an enlarged view of a portion of the display panel shown in FIG. 5 in accordance with some embodiments.

A box illustrated in FIG. 6 indicates a portion 700 of the display panel 400 that is shown in detail in FIG. 7.

FIG. 7 illustrates an enlarged view of a portion 700 of the display panel 400 shown in FIG. 5 in accordance with some embodiments. The portion 700 shows a distance between adjacent light emitters in the first emission region, a distance between adjacent light emitters in the second emission region, and a distance between adjacent light emitters in the third emission region.

In FIG. 7, the first emission region includes a light emitter 701-1 that is adjacent to a neighboring light emitter 701-2 in the first emission region. The light emitter 701-1 is located adjacent to the second emission region (e.g., the light emitter 701-1 is located adjacent to a border between the first emission region and the second emission region) and, in particular, a light emitter 710-1 in the second emission region. The light emitter 710-1 is located adjacent to the first emission region (e.g., the light emitter 710-1 is located adjacent to the border between the first emission region and the second emission region) and, in particular, the light emitter 701-1.

The display panel also includes a light emitter 710-3 that is adjacent to a neighboring light emitter 710-4 in the second emission region. The light emitter 710-3 is located adjacent to the third emission region (e.g., the light emitter 710-3 is located adjacent to a border between the second emission region and the third emission region) and, in particular, a light emitter 720-1 in the third emission region. The light emitter 720-1 is located adjacent to the second emission region (e.g., the light emitter 720-1 is located adjacent to the border between the second emission region and the third emission region) and, in particular, the light emitter 710-3.

In FIG. 7, the light emitter 701-1 is spaced apart from the neighboring light emitter 701-2 in the first emission region by the first distance D1 and the second light emitter 710-1 is spaced apart from the neighboring light emitter 710-2 in the second emission region by the second distance D2. The light emitter 701-1 is spaced apart from the light emitter 710-1 by a distance S1. In some embodiments, the distance S1 is at most the second distance D2 (e.g., the distance S1 is equal to, or less than, the second distance D2).

In FIG. 7, the light emitter 710-3 is spaced apart from the neighboring light emitter 710-4 in the second emission region by the second distance D2 and the light emitter 720-1 is spaced apart from the neighboring light emitter 720-2 in the third emission region by the third distance D3. The light emitter 710-3 is spaced apart from the light emitter 720-1 by a distance S2. In some embodiments, the distance S2 is at most the third distance D3 (e.g., the distance S2 is equal to, or less than, the third distance D3).

In FIG. 7, some light emitters in each emission region are omitted so as not to obscure other aspects of these emission regions and light emitters located therein.

As described herein, the display panel (e.g., the display panel 400) provides a high-resolution display region and a low-resolution display region. In FIG. 6, a distance (e.g., the second distance 620) between two light emitters in a low-resolution region (e.g., the second emission region 420) of the display panel is greater than a distance (e.g., the first distance 610) between two light emitters in a high-resolution region (e.g., the first emission region 410). In this configuration, the screen-door effect is more visible in the low-resolution region as the gap between the two light emitters in the low-resolution region is greater than the gap between the two light emitters in the high-resolution region. In some cases, the screen-door effect is more noticeable to a user depending on a gaze direction of the user.

In order to reduce, alleviate, and/or eliminate the screen-door effect, a filter coupled with the display panel is used. The filter is configured to transmit light projected by the display panel. In some embodiments, the filter is located between the light emission device array 310 and one or more lenses 330 described with respect to FIG. 3. The filter has multiple filter regions that correspond to the multiple emission regions having different densities of light emitters. The multiple filter regions are configured to cause respective distributions of light emitted by light emitters in a corresponding emission region. The respective distributions of light at least partially overlap one another to fill the gap between light emitters in the corresponding emission region. Thus, the screen-door effect is reduced or eliminated regardless of the densities of light emitters. In addition, each filter region is configured for a corresponding emission region, thereby maintaining the display resolution of the display device.

Figure 8:
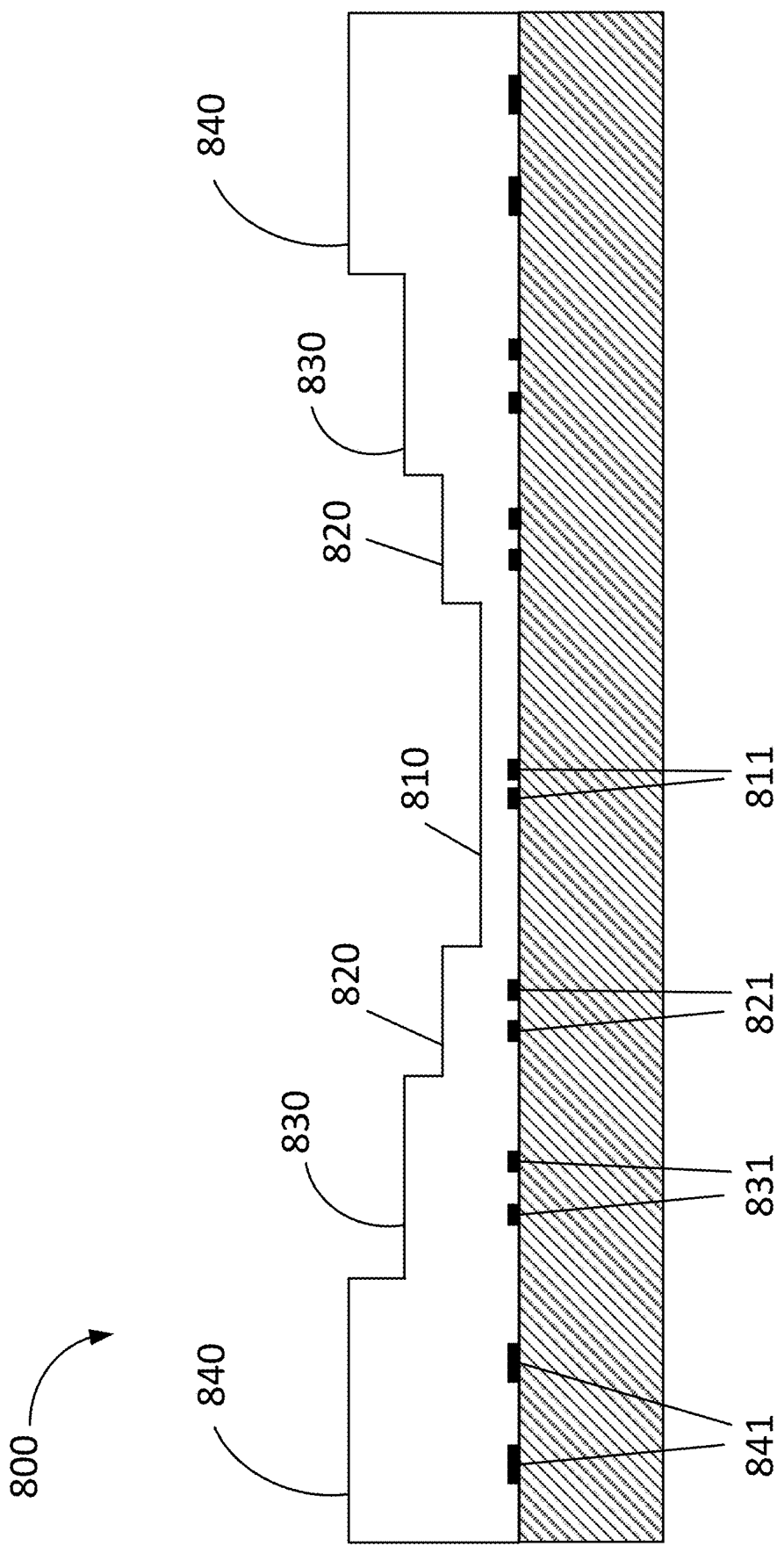
FIG. 8 illustrates a cross-sectional view of a display panel that is coupled with a filter in accordance with some embodiments.

FIG. 8 illustrates a cross-sectional view of a display panel 800 that is coupled with a filter in accordance with some embodiments. Line AA' in FIG. 4 represents a view from which the cross-sectional shown in FIG. 8 is taken.

The display panel includes a plurality of light emitters 811 in the first emission region (e.g., light emitters 510 in FIG. 5), and a plurality of light emitters 821 in the second emission region (e.g., light emitters 520 in FIG. 5). In some embodiments, the display panel also includes a plurality of light emitters 831 in the third emission region (e.g., light emitters 530 in FIG. 5). In some embodiments, the display panel further includes a plurality of light emitters 841 in the fourth emission region (e.g., light emitters 540 in FIG. 5). In FIG. 8, one or two pairs of light emitters are illustrated for each emission region as representative light emitters. However, as shown in FIG. 5, each emission region typically has more than one or two pairs of light emitters (e.g., each emission region may have tens, hundreds, or thousands of light emitters). In some embodiments, two light emitters that are adjacent to each other, in the first emission region are spaced apart from each other by a first representative distance (e.g., the first distance 610 in FIG. 6). In some embodiments, two light emitters that are adjacent to each other, in the second emission region are spaced apart from each other by a second representative distance (e.g., the second distance 620 in FIG. 6) that is greater than the first representative distance. In some embodiments, the first representative distance is deemed to be a center-to-center distance between two adjacent light emitters in the first emission region and the second representative distance is deemed to be a center-to-center distance between two adjacent light emitters in the second emission region. In some embodiments, the first representative distance is deemed to be an edge-to-edge distance between two adjacent light emitters in the first emission region, and the second representative distance is deemed to be an edge-to-edge distance between two adjacent light emitters in the second emission region.

In some embodiments, the filter is placed over the display panel to transmit light projected by the display panel. As shown in FIG. 8, the filter includes a first filter region 810, a second filter region 820, a third filter region 830, and a fourth filter region 840. Each of filter regions corresponds to each of emission regions. In some embodiments, the first filter region 810, that corresponds to the first emission region (e.g., the first emission region 410), is configured to change a direction of at least a portion of light emitted by the plurality of light emitters in the first emission region (e.g., light emitters 811), and the second filter region 820, that corresponds to the second emission region (e.g., the second emission region 420), is configured to change a direction of at least a portion of light emitted by the plurality of light emitters in the second emission region (e.g., light emitters 821). In some embodiments, the third filter region 830 corresponding to the third emission region (e.g., the third emission region 430), is configured to change a direction of at least a portion of light emitted by the plurality of light emitters in the third emission region (e.g., light emitters 831), and the fourth filter region 840 corresponding to the fourth emission region (e.g., the fourth emission region 440), is configured to change a direction of at least a portion of light emitted by the plurality of light emitters in the fourth emission region (e.g., light emitters 841). Although FIG. 8 illustrates four filter regions of the filter, the number of filter regions is not limited to four. Rather, the filter may have fewer or more than four filter regions (e.g., at least 2, 3, 5, 6, or 7 regions, etc.) in accordance with the number of emission regions of the display panel 400.

In some embodiments, a bottom surface of the filter (e.g., a surface of the filter positioned toward the light emitters) is in contact with the light emitters, as shown in FIG. 8. In some embodiments, the bottom surface of the filter is configured (e.g., shaped) to encapsulate the light emitters, as shown in FIG. 8 (e.g., a plurality of indentations is defined on the bottom surface of the filter so that the bottom surface of the filter mates at least partially with the light emitters). In some embodiments, the bottom surface of the filter is configured to come in contact with the light emitters without encapsulating the light emitters (e.g., the bottom surface of the filter is a flat surface). In some embodiments, the bottom surface of the filter is positioned apart from the light emitters (e.g., the bottom surface of the filter is not in contact with the light emitters).

In some embodiments, each filter region of a plurality of filter regions has a same shape as a corresponding emission region of a plurality of emission regions as described above with respect to FIGS. 4 and 5 (e.g., the dimension of each filter region is the same as the dimension of a corresponding emission region). In some embodiments, the first filter region 810 is surrounded by the second filter region 820 that is distinct from and mutually exclusive to the first filter region 810. In some embodiments, the second filter region 820 is surrounded by the third filter region 830 that is distinct from and mutually exclusive to the second filter region 820, and the third filter region 830 is surrounded by the fourth filter region 840 that is distinct from and mutually exclusive to the third filter region 830.

In some embodiments, the filter is configured to change a direction of at least a portion of light transmitted through the filter (or each of filter regions) by at least one of: (i) scattering the at least a portion of light or (ii) causing diffraction of the at least a portion of light. For example, in some embodiments, both of the first filter region 810 and the second filter region 820 are configured to scatter the at least a portion of light emitted by the plurality of light emitters in the first emission region and the at least a portion of light emitted by the plurality of light emitters in the second emission region. In some embodiments, both of the first filter region 810 and the second filter region 820 are configured to cause diffraction of the at least a portion of light emitted by the plurality of light emitters in the first emission region and the at least a portion of light emitted by the plurality of light emitters in the second emission region. Alternatively, in some embodiments, the first filter region 810 is configured to scatter the at least a portion of light emitted by the plurality of light emitters in the first emission region, and the second filter region 820 is configured to cause diffraction of the at least a portion of light emitted by the plurality of light emitters in the second emission region. In some embodiments, the filter is configured to scatter at least a portion of light transmitted through the filter by at least one of: volume scattering or surface scattering.

In some embodiments, the filter includes one or more filter elements. In some embodiments, the one or more filter elements are disposed on a surface of the filter facing toward the display panel and/or an opposing surface of the filter (e.g., a surface of the filter facing away from the display panel). In some embodiments, the one or more filter elements include at least one of: surface-relief gratings, microstructured surfaces, diffraction gratings, volume holograms, or small-angle scattering elements. In some embodiments, the surface-relief gratings and the diffraction gratings are configured to direct respective portions of light from the display panel in different directions at particular diffraction angles. In some embodiments, the surface-relief gratings and the diffraction gratings have periodic structures for causing the diffraction. In some embodiments, the microstructured surfaces and the small-angle scattering elements are configured to scatter the at least a portion of the light transmitted through the filter. In some embodiments, the at least a portion of light transmitted through the filter are scattered by either the microstructured surfaces or the small-angle scattering elements in a forward direction with a particular angle distribution. In some embodiments, the volume holograms are used for either scattering the at least a portion of light or causing diffraction of the at least a portion of light. In some embodiments, at least one filter region has a different filter element from other filter regions. For example, in some cases, the filter includes the diffraction gratings for the first filter region 810, the volume holograms for the second filter region 820 and the third filter region 830, and the small-scattering elements for the fourth filter region 840.

In some embodiments, a magnitude of a directional change for the at least a portion of light emitted by the plurality of light emitters in the second emission region is greater than a magnitude of a directional change for the at least a portion of light emitted by the plurality of light emitters in the first emission region. In some embodiments, a magnitude of a directional change for the at least a portion of light emitted by the plurality of light emitters in the third emission region is greater than a magnitude of a directional change for the at least a portion of light emitted by the plurality of light emitters in the second emission region. In some embodiments, a magnitude of a directional change for the at least a portion of light emitted by the plurality of light emitters in the fourth emission region is greater than a magnitude of a directional change for the at least a portion of light emitted by the plurality of light emitters in the third emission region. In some embodiments, a magnitude of a directional change for at least a portion of light transmitted through the filter is determined by at least one of: a diffractive pattern pitch of the diffraction gratings, a hologram pitch and thickness of the volume holograms, or a scattering index and thickness for the small-angle scattering elements.

Figure 9A:
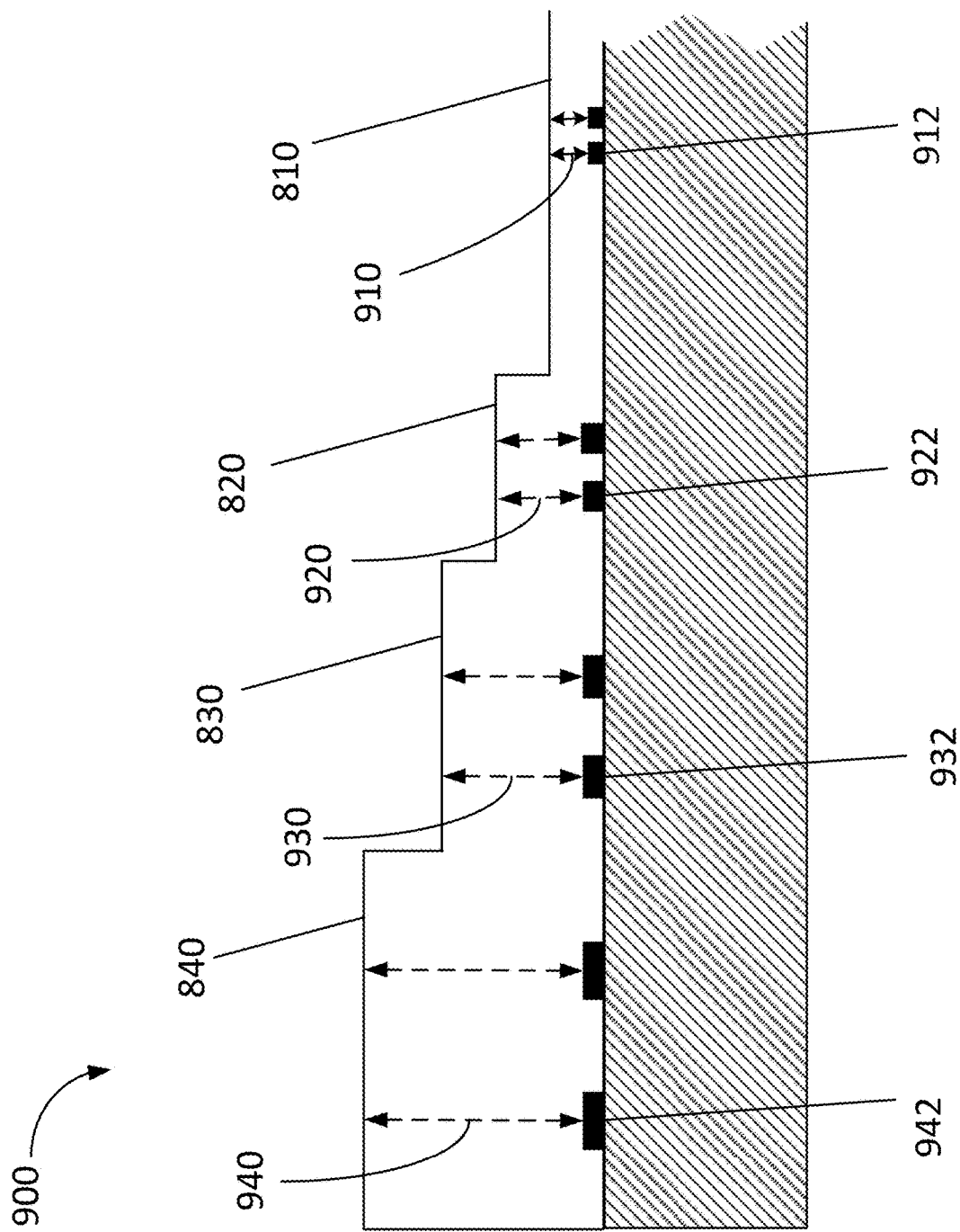
FIG. 9A illustrates an enlarged view of the display panel and the filter shown in FIG. 8 in accordance with some embodiments.

FIG. 9A illustrates enlarged view 900 of the display panel and the filter shown in FIG. 8 in accordance with some embodiments.

A respective filter region of the filter is configured to cause at least partially overlap of light emitted by light emitters in a corresponding emission region.

As explained above with respect to FIG. 8, light emitters in a respective emission region of the display panel are spaced apart by a different distance (e.g., light emitters in the first emission region are spaced apart by the first distance 610, light emitters in the second emission region are spaced apart by the second distance 620 that is distinct from the first distance 610, etc.). A planar filter with each filter region located at a same distance to light emitters in a corresponding emission region (e.g., the filter regions are located on a same plane) presents various deficiencies when used with such display panel. For example, if all of the filter regions are located at a distance to cause an overlap of light emitted by two adjacent light emitters in an emission region with the greatest spacing between light emitters (e.g., a peripheral region), the filter reduces the resolution of light emitted by light emitters in an emission region with the least spacing (e.g., the central region). If all of the filter regions are located at a distance to cause an overlap of light emitted by two adjacent light emitters in an emission region with the least spacing between light emitters (e.g., the central region), in some cases, the filter is able to cause an overlap of light emitted by two adjacent light emitters in an emission region with the greatest spacing between light emitters (e.g., the peripheral region). Thus, the gap between the light emitters remains visible.

In FIG. 9A, the filter has a plurality of filter regions that has different distances to light emitters in corresponding emission regions (e.g., a staircase structure). This structure causes at least a partially overlap of light emitted by at least two light emitters for a plurality of light emission regions. In addition, this reduces or avoids excessive blurring of light emitted by light emitters in an emission region (e.g., the central region) with the least spacing between light emitters.

Enlarged view 900 illustrates a portion of a filter that includes the first filter region 810, the second filter region 820, the third filter region 830, and the fourth filter region 840. In some embodiments, the first filter region 810 is parallel to a plane defined by light emitters in the first emission region. In some embodiments, the second filter region 820 is parallel to a plane defined by light emitters in the second emission region. In some embodiments, the third filter region 830 is parallel to a plane defined by light emitters in the third emission region. In some embodiments, the fourth filter region 840 is parallel to a plane defined by light emitters in the fourth emission region.

As shown in FIG. 9A, a distance 940 from a light emitter 942 in the fourth emission region to the fourth filter region 840 is greater than a distance 930 from a light emitter 932 in the third emission region to the third filter region 830. The distance 930 is greater than a distance 920 from a light emitter 922 in the second emission region to the second filter region 820, and the distance 920 is greater than a distance 910 from a light emitter 912 in the first emission region to the first filter region 810.

In FIG. 9A, a plurality of light emitter in a same emission region has a same distance to a corresponding filter region. For example, a plurality of light emitters in the first emission region has a same distance (910) to the first filter region 810 and a plurality of light emitters in the second emission region has a same distance (920) to the second filter region 820. Moreover, a plurality of light emitters in the third emission region has a same distance (930) to the third filter region 830 and a plurality of light emitters in the fourth emission region has a same distance (940) to the fourth filter region 840.

Figure 9B:
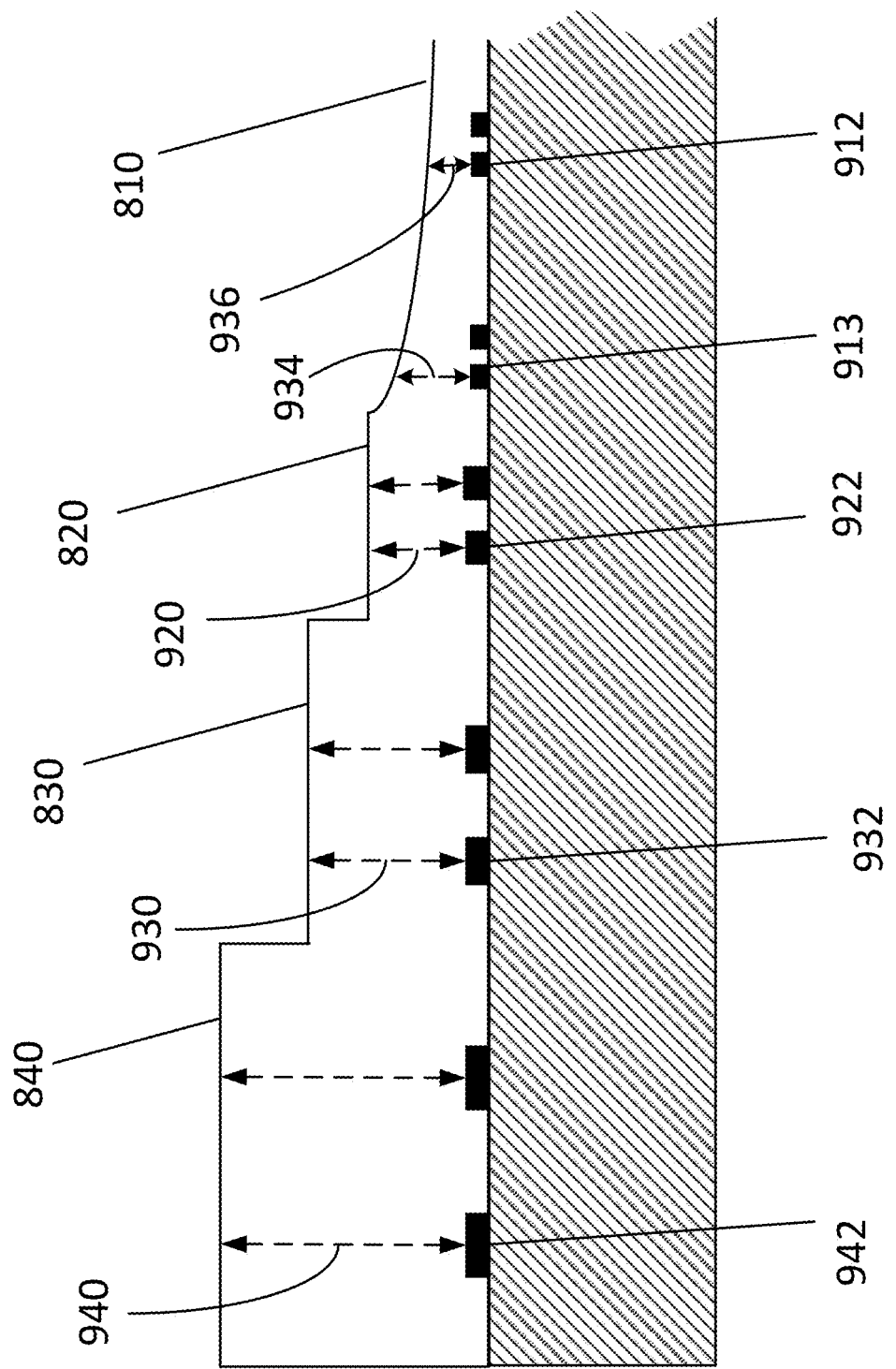
FIG. 9B illustrates a cross-sectional view of a display panel coupled with a filter in accordance with some embodiments.

FIG. 9B illustrates a cross-sectional view of a display panel coupled with a filter in accordance with some embodiments. The cross-sectional view shown in FIG. 9B is similar to the cross-sectional view shown in FIG. 9A except that a distance from a light emitter to a filter region reduces continuously as a function of a distance from the light emitter to a reference position on a display panel (e.g., a geometric center, etc.) of a display panel. For example, a vertical distance 934 from a light emitter 913, located in the first emission region adjacent to a border between the first emission region and the second emission region, to the first filter region 810 is greater than a vertical distance 936 from a light emitter 912, located in the first emission region adjacent to a center of the first emission region, to the first filter region 810. In some embodiments, a distance from a light emitter to a filter region increases linearly as a function of a distance from the light emitter to a reference position on a display panel (e.g., a geometric center, etc.) of a display panel. In some embodiments, a distance from a light emitter to a filter region increases nonlinearly (e.g., quadratically, parabolically, logarithmically, etc.) as a function of a distance from the light emitter to a reference position on a display panel (e.g., a geometric center, etc.) of a display panel, as shown in FIG. 9B. The change may also be non-monotonic, where for example, the filter provides a low degree of depixelization in the center of the display, a higher degree of depixelization half-way between the center and at least one edge of the display, and a degree of depixelization in the display region that is near the edge of the display that has a depixelization that is intermediate between the center and half-way regions of the display.

Although FIG. 9B shows that only the first filter region 810 has a continuously reducing height (or a distance from a light emitter located thereunder), in some embodiments, more than one filter regions have respective continuously reducing height profiles. For example, in some cases, the first filter region 810 has a first continuously reducing height profile and the second filter region 820 has a second continuously reducing height profile that has a slope, at a junction between the first filter region 810 and the second filter region 820, that is different from the slope of the first continuously reducing height profile at the junction between the first filter region 810 and the second filter region 820. In some cases, the first filter region 810 has a first continuously reducing height profile and the second filter region 820 has a second continuously reducing height profile that has a slope, at a junction between the first filter region 810 and the second filter region 820, that is identical to the slope of the first continuously reducing height profile at the junction between the first filter region 810 and the second filter region 820.

Figure 10:
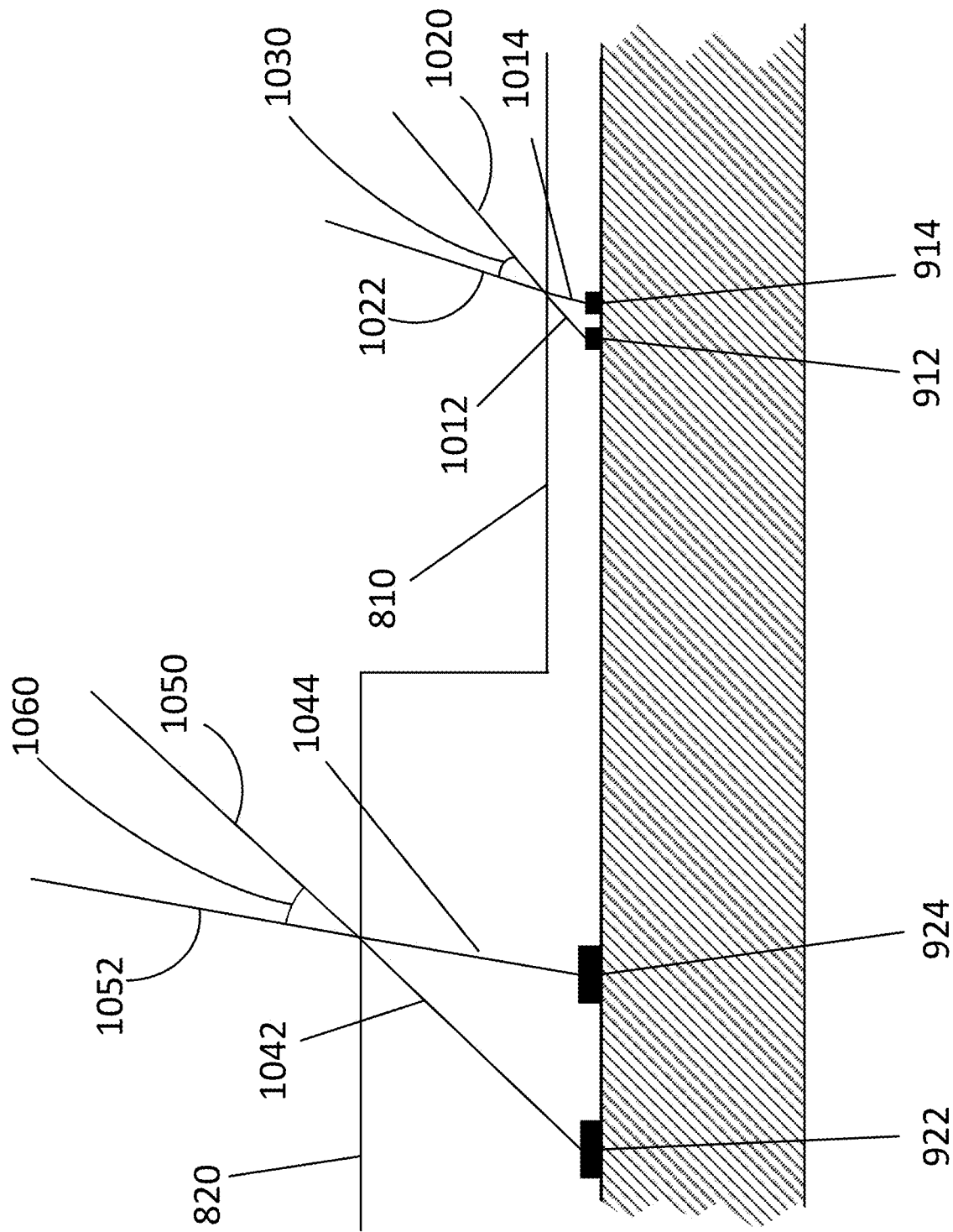
FIG. 10 illustrates operations of a filter in accordance with some embodiments.

FIG. 10 illustrates operations of a filter in accordance with some embodiments.

In FIG. 10, the first filter region 810 causes respective distributions of light emitted by light emitters in the first emission region, and the second filter region 820 causes respective distributions of light emitted by light emitters in the second emission region.

In some embodiments, a respective filter region is configured to cause a particular distribution of light emitted by a light emitter in a corresponding emission region of the display panel by scattering at least a portion of light (e.g., at least one beam or at least one ray) or causing diffraction of the at least a portion of light. In some embodiments, the particular distribution includes light transmitted into two or more directions. In some embodiments, the distribution is characterized by a distribution profile. A distribution profile describes properties of the distributed light (e.g., intensity of light, diffraction orders, a diffraction angle, etc.). In some embodiments, the distribution has a representative angle that is formed by a zeroth order ray and a first order ray of a distribution caused by diffraction of at least a portion of light emitted by a light emitter in a corresponding emission region. In some embodiments, the distribution profile includes information identifying angles of light that correspond to diffraction orders. The zeroth order ray corresponds to a direction of light emitted by a light emitter, and the first order ray is transmitted in the direction corresponding to a particular diffraction angle.

In FIG. 10, diffractions of light caused by the first filter region 810 and the second filter region 820 are shown. For illustration purpose, two adjacent light emitters 912, 914 in the first emission region and two adjacent light emitters 922, 924 in the second emission region are illustrated in FIG. 10. As described above with respect to FIG. 8, the two adjacent light emitters 912, 914 are spaced apart from each other by the first representative distance and the two adjacent light emitters 922, 924 are spaced apart from each other by the second representative distance that is greater than the first representative distance.

As shown in FIG. 10, in some embodiments, the first filter region 810 is configured to cause a first distribution of light (e.g., a ray 1012) emitted from a first light emitter 912 of two light emitters 912, 914 in the first emission region and a second distribution of light (e.g., a ray 1014) emitted from a second light emitter 914 of the two light emitters 912, 914 in the first emission region. The first distribution includes at least two rays including two rays 1020, 1022 that correspond to diffraction of the ray 1012 (e.g., a zeroth order ray and a first order ray of the first distribution). The second distribution includes at least two rays (including ray 1022) that correspond to diffraction of the ray 1014 (e.g., a zeroth order ray and a first order ray of the second distribution). In some embodiments, the first filter region 810 aligns at least one ray (e.g., the ray 1022) of the second distribution with the ray 1022 of the first distribution so that the first distribution at least partially overlaps with the second distribution. In this manner the first filter region 810 is able to fill the gap between the two light emitters 912, 914 and alleviate the screen-door effect. In some embodiments, the second distribution has a distribution profile that corresponds to a distribution profile of the first distribution. In some embodiments, the first distribution has a first representative angle 1030 formed by the zeroth order ray (e.g., a ray 1020) and the first order ray (e.g., a ray 1022) of the first distribution, and the second distribution has a second representative angle formed by the zeroth order ray (e.g., the ray 1022) and the first order ray of the second distribution (not illustrated in FIG. 10). In some embodiments, the first representative angle 1030 is substantially identical to the second representative angle.

As shown in FIG. 10, in some embodiments, the second filter region 820 is configured to cause a third distribution of light or at least a portion of light (e.g., a ray 1042) emitted from a first light emitter 922 of two light emitters 922, 924 in the second emission region and a fourth distribution of light or at least a portion of light (e.g., a ray 1044) emitted from a second light emitter 924 of the two light emitters 922, 924 in the second emission region. The third distribution includes at least two rays including two rays 1050, 1052 that correspond to diffraction of the ray 1042 (e.g., a zeroth order ray and a first order ray of the third distribution). The fourth distribution includes at least two rays (including the ray 1052) that correspond to diffraction of the ray 1044 (e.g., a zeroth order ray and a first order ray of the fourth distribution). In some embodiments, the second filter region 820 aligns at least one ray (e.g., the ray 1052) of the fourth distribution with the ray 1052 of the third distribution so that the third distribution at least partially overlaps with the fourth distribution. In this manner the second filter region 820 is able to fill the gap between the two light emitters 922, 924 and alleviate the screen-door effect. In some embodiments, the third distribution has a distribution profile that corresponds to a distribution profile of the first distribution (or the second distribution), and the fourth distribution has a distribution profile that corresponds to a distribution profile of the third distribution. In some embodiments, the third distribution has a third representative angle 1060 formed by the zeroth order ray (e.g., a ray 1050) and the first order ray of the third distribution (e.g., a ray 1052), and the fourth distribution has a fourth representative angle formed by the zeroth order ray (e.g., the ray 1052) and the first order ray of the fourth distribution (not illustrated in FIG. 10). In some embodiments, the third representative angle 1060 is substantially identical to the fourth representative angle. In some embodiments, the third representative angle 1060 is substantially identical to the first representative angle 1030.

Figure 11:
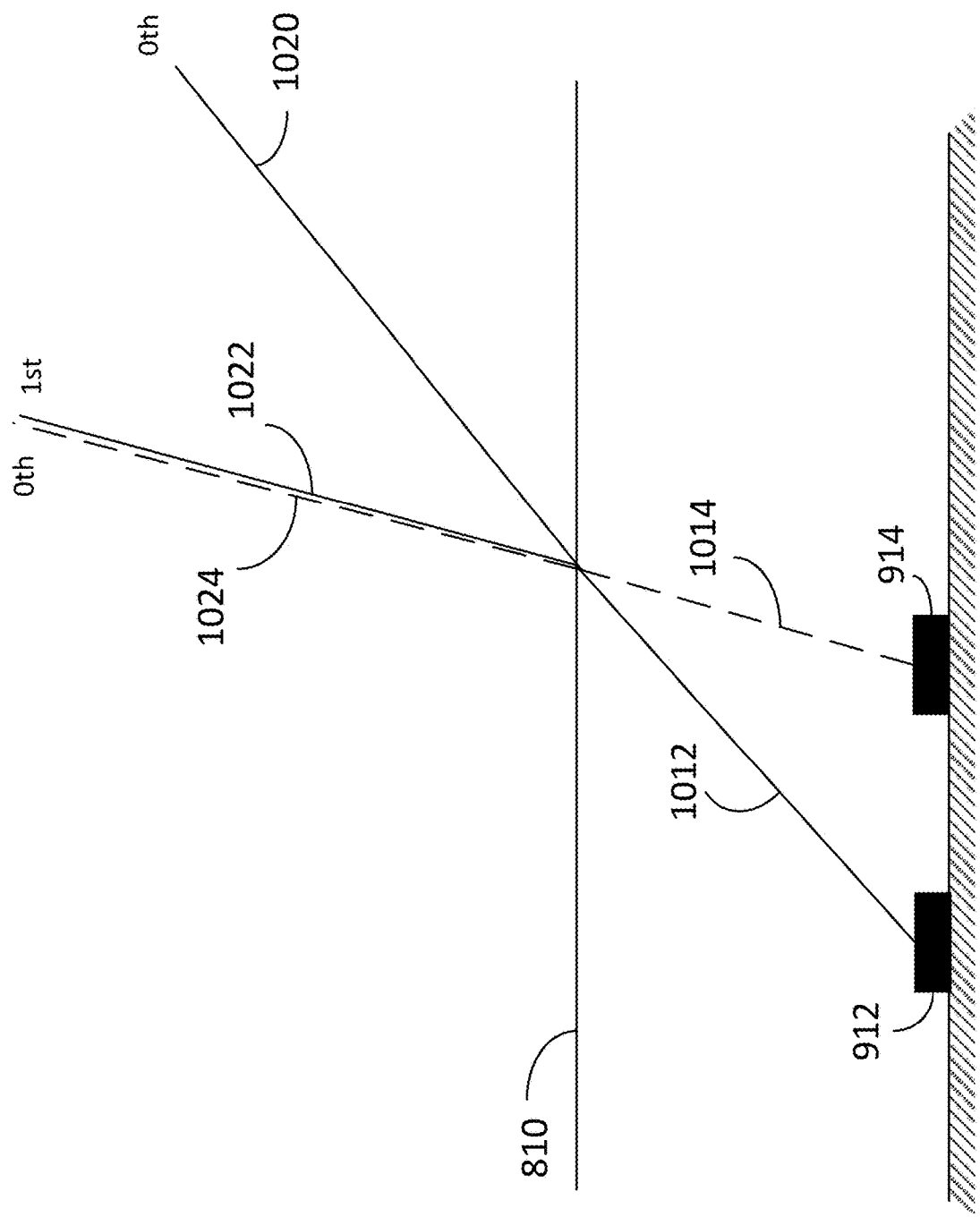
FIG. 11 is an enlarged view of FIG. 10.

FIG. 11 is an enlarged view of FIG. 10. In FIG. 11, the first distribution at least partially overlaps with the second distribution.

The first filter region 810 is configured to cause the first distribution of the ray 1012 emitted by the first light emitter 912 that includes at least two rays including two rays 1020, 1022. A ray 1020 is referred to as a zeroth order ray of the first distribution, and a ray 1022 is referred to as a first order ray of the first distribution. The first filter region 810 is further configured to cause the second distribution of the ray 1014 emitted by the second light emitter 914 that includes one or more rays including a ray 1024. The ray 1024 is referred as to a zeroth ray of the second distribution. The first filter region 810 is configured to align the ray 1024 with the ray 1022 so that the ray 1022 appears to be emitted from a same light emitter. In some embodiments, the ray 1012 has a different wavelength from the ray 1014. For example, the ray 1012 has a wavelength corresponding to a red color and the ray 1014 has a wavelength corresponding to a green color. The first filter region 810 aligns the ray 1024 with the ray 1022, so that the light emitter 914 appears to provide both red and green lights.

Figure 12A:
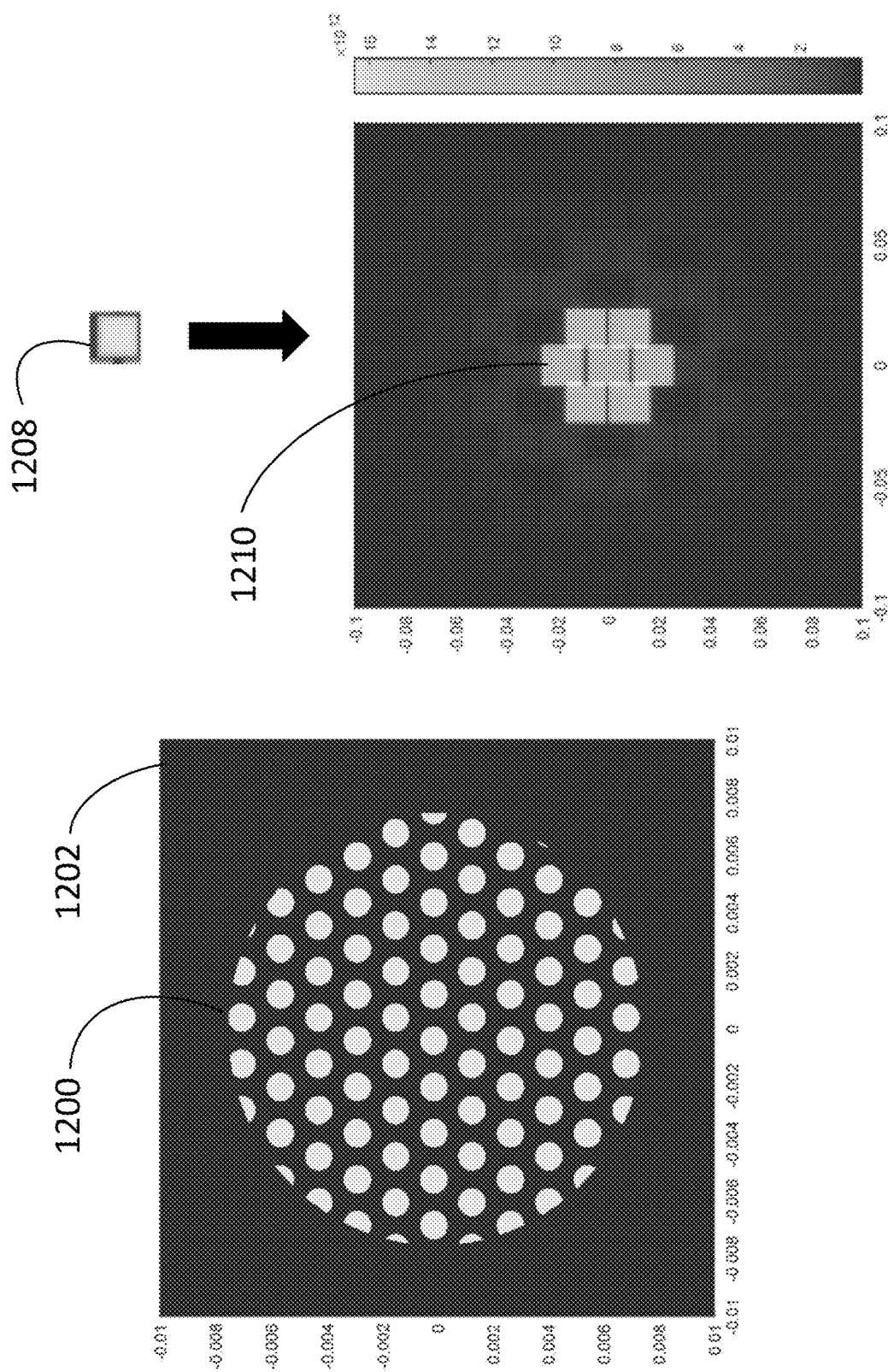

FIG. 12A shows a plan view of an example filter in accordance with some embodiments (shown on the left-hand side).

In some embodiments, a filter has dielectric posts 1200 disposed on a surface 1202 of the filter. In some embodiments, the dielectric posts 1200 have a binary pillar structure. In some embodiments, the binary pillar structure has a plurality of pillars each having a particular height (e.g., half a micron). In some embodiments, the filter is made of an array of refractive elements, for example, and array of lenses. The lenses preferably have a diameter of less than the pitch of the emitters.

FIG. 12A also shows (on the right-hand side) a light emitter 1208 having a rectangular shape and a shape of light 1210 transmitted through the filter.

Figure 12B:
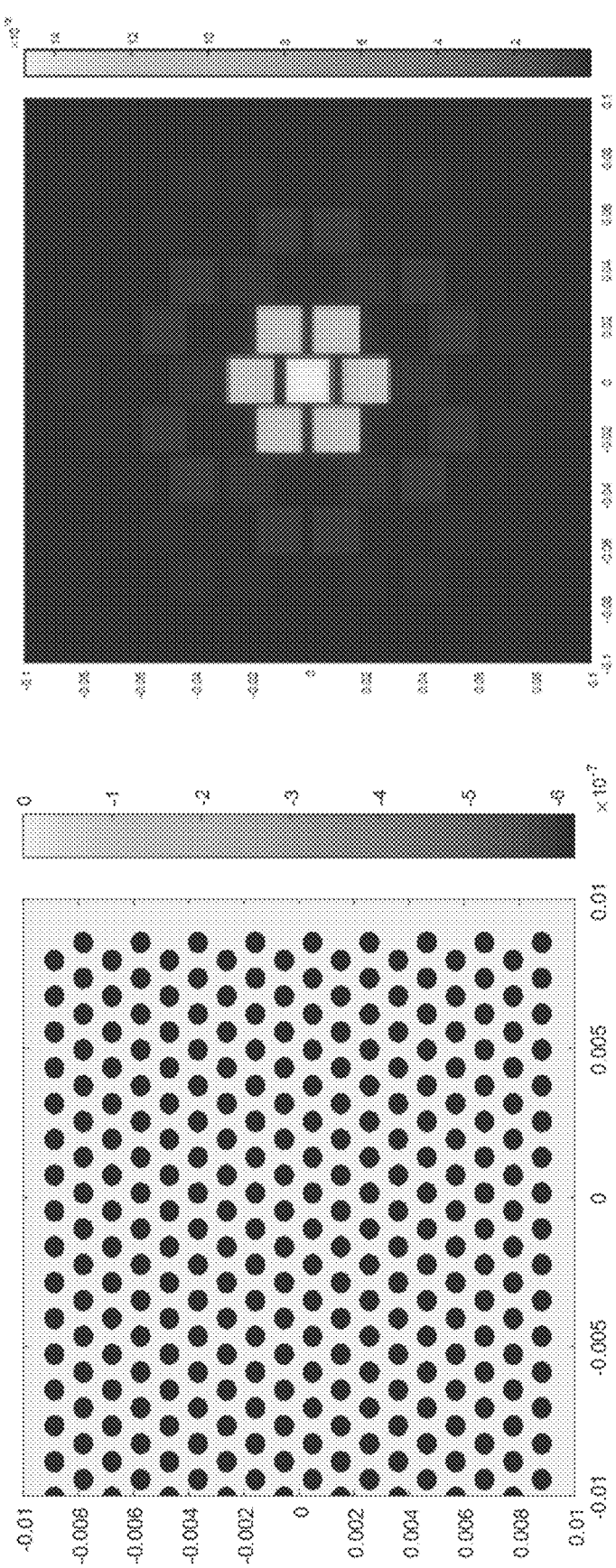
Figure 12D:
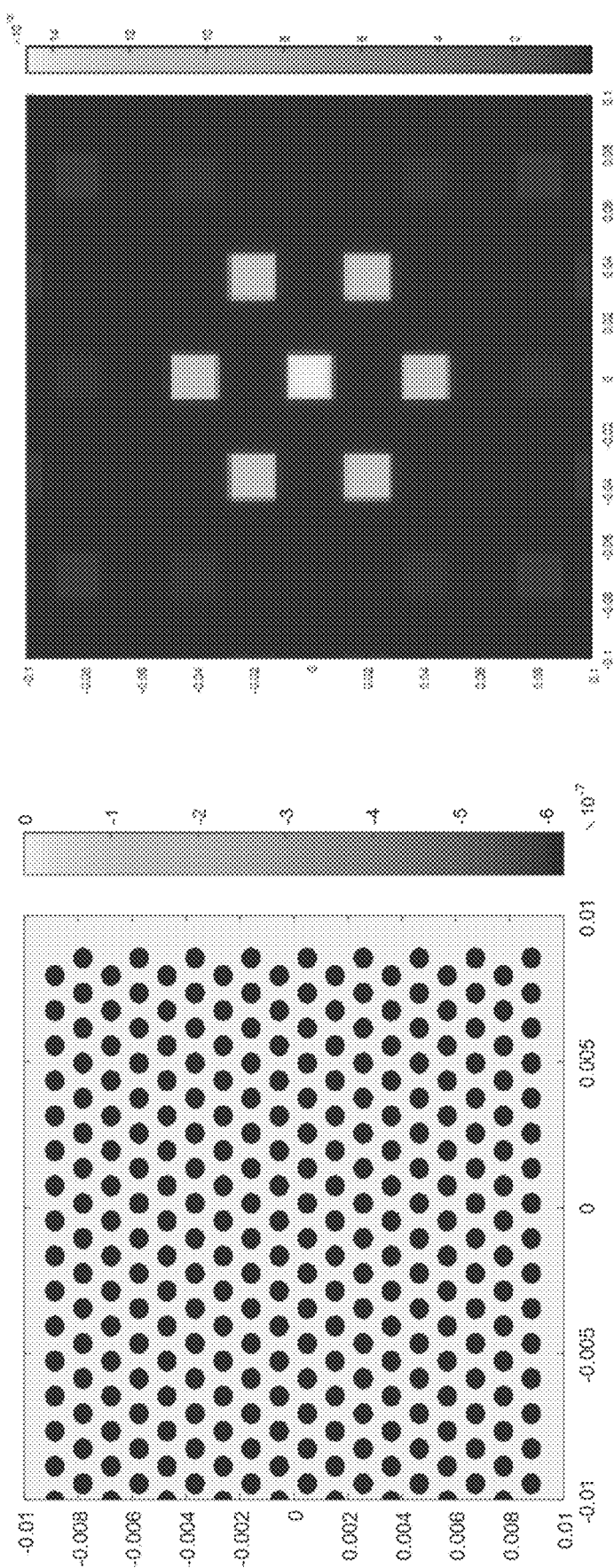

FIGS. 12B-12D illustrate the effect of a fill-ratio and a filter distance in accordance with some embodiments.

The left-hand side of FIG. 12B illustrates a filter with binary features (e.g., holes) in accordance with some embodiments. The right hand-side of FIG. 12B illustrates a shape of light transmitted through the filter.

The left-hand side of FIG. 12C illustrates a filter with binary features (e.g., holes) in accordance with some embodiments. The size of the holes shown in FIG. 12C is smaller than the size of holes shown in FIG. 12B. The right hand-side of FIG. 12C illustrates a shape of light transmitted through the filter shown in FIG. 12C.

The left-hand side of FIG. 12D illustrates a filter with binary features (e.g., holes) in accordance with some embodiments. The size of the holes shown in FIG. 12D is the same as the size of holes shown in FIG. 12B. However, the filter shown in FIG. 12D is located from light emitters at a distance that is twice the distance between the filter shown in FIG. 12B and light emitters. The right hand-side of FIG. 12D illustrates a shape of light transmitted through the filter shown in FIG. 12D.

As shown above, the distribution of light is adjusted by changing the size of holes and/or the distance between the filter and the light emitters.

Figure 13A:
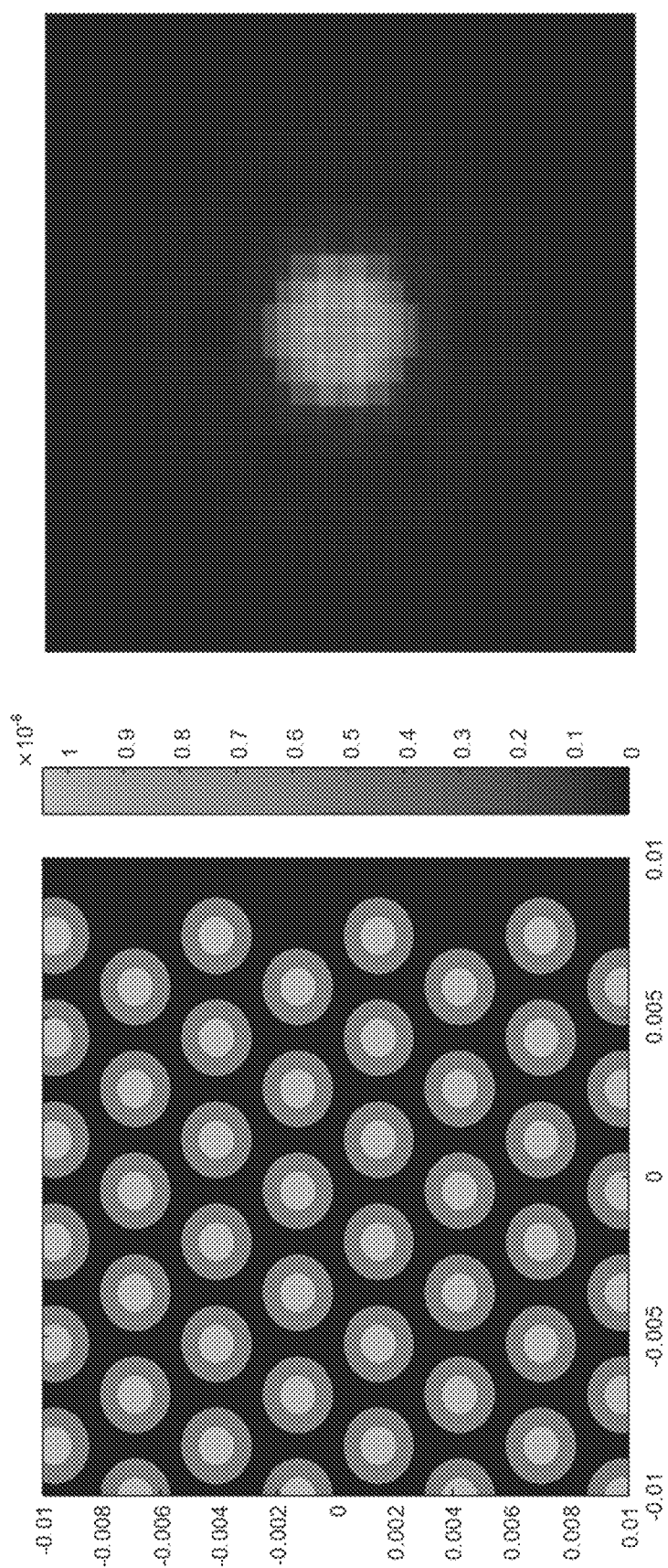

FIGS. 13A-13C illustrate the effect of a fill-ratio and a filter distance in accordance with some embodiments.

The left-hand side of FIG. 13A illustrates a filter with multi-step features (e.g., pillar structures) in accordance with some embodiments. In some embodiments, the pillar structure includes a peripheral pillar having a first height and a central pillar having a second height that is greater than the first height. The right hand-side of FIG. 13A illustrates a shape of light transmitted through the filter.

The left-hand side of FIG. 13B illustrates a filter with multi-step features (e.g., pillar structures) in accordance with some embodiments. The size (e.g., the width) of the multi-step features shown in FIG. 13B is smaller than the size of multi-step features shown in FIG. 13A. The right hand-side of FIG. 13B illustrates a shape of light transmitted through the filter shown in FIG. 13B.

The left-hand side of FIG. 13C illustrates a filter with multi-step features (e.g., pillar structures) in accordance with some embodiments. The size (e.g., the width) of the multi-step features shown in FIG. 13C is the same as the size of the multi-step features shown in FIG. 13A. However, the filter shown in FIG. 13C is located from light emitters at a distance that is twice the distance between the filter shown in FIG. 13A and light emitters. The right hand-side of FIG. 13C illustrates a shape of light transmitted through the filter shown in FIG. 13C.

As shown above, the distribution of light is adjusted by changing the size of the multi-step features and/or the distance between the filter and the light emitters.

FIG. 14 is a flow diagram illustrating method 1400 for processing light projected by a display panel (e.g., the display panel 400 in FIGS. 4-5) in accordance with some embodiments. The display panel has a first emission region (e.g., the first emission region 410) and a second emission region (e.g., the second emission region 420) that is mutually exclusive to the first emission region and surrounds the first emission region. The method illustrated in FIG. 14 is performed by the filter that is coupled with the display panel as described above with respect to FIGS. 8-13C. In some embodiments, the filter is also included in a display device (e.g., display device 300 in FIG. 3).

The method includes causing (1410), with a first filter region (e.g., the first filter region 810) configured to change a direction of at least a portion of light emitted by a plurality of light emitters arranged in the first emission region, a first distribution of light emitted from a first light emitter (e.g., the first light emitter 912) of two light emitters of the plurality of light emitters in the first emission region, and a second distribution of light emitted from a second light emitter (e.g., the second light emitter 914) of the two light emitters of the plurality of light emitters in the first emission region so that the first distribution at least partially overlaps with the second distribution as described above with respect to FIGS. 10-11. The method also includes causing (1410), with a second filter region (e.g., the second filter region 820) configured to change a direction of at least a portion of light emitted by a plurality of light emitters arranged in the second emission region, a third distribution of light emitted from a first light emitter (e.g., the first light emitter 922) of two light emitters of the plurality of light emitters in the second emission region, and a fourth distribution of light emitted from a second light emitter (e.g., the second light emitter 924) of the two light emitters of the plurality of light emitters in the second emission region so that the third distribution at least partially overlaps with the fourth distribution as described above with respect to FIGS. 10-11. In some embodiments, the two light emitters, that are adjacent to each other, in the first emission region are spaced apart from each other by a first representative distance (e.g., the first distance 610, or the first distance D1) as described above with respect to FIG. 5-8. In some embodiments, the two light emitters, that are adjacent to each other, in the second emission region are spaced apart from each other by a second representative distance (e.g., the second distance 620, or the second distance D2) that is greater than the first representative distance as described above with respect to FIG. 5-8.

In some embodiments, (1411) a distance (e.g., the distance 920) from a light emitter (e.g., the light emitter 922) in the second emission region to the second filter region (e.g., the second filter region 820) is greater than a distance (e.g., the distance 910) from a light emitter (e.g., the light emitter 912) in the first emission region to the first filter region (e.g., the first filter region 810) as described above with respect to FIG. 9A.

In light of these principles, we turn to certain embodiments.

In accordance with some embodiments, an optical filter includes a first filter region (e.g., first filter region 810 in FIG. 10) configured to cause distribution of light impinging on the first filter region in a first manner so that light from two emitters (e.g., light emitters 912 and 914) having a first distance between the two emitters with a gap between the two emitters appears to be emitted from two emitters positioned without a gap between the two emitters; and a second filter region (e.g., second filter region 820) configured to cause distribution of light impinging on the second filter region in a second manner so that light from two emitters (e.g., light emitters 922 and 924) having a second distance that is different from the first distance between the two emitters with a gap between the two emitters appears to be emitted from two emitters positioned without a gap between the two emitters.

In accordance with some embodiments, a display device includes a display panel (e.g., the display panel 400 in FIG. 4) including a plurality of light emitters in a first emission region (e.g., the first emission region 410) of the display panel, and a plurality of light emitters in a second emission region (e.g., the second emission region 420) of the display panel that is distinct from and mutually exclusive to the first emission region and surrounds the first emission region. Two light emitters, that are adjacent to each other, in the first emission region are spaced apart from each other by a first representative distance (e.g., the first distance 610, or the first distance D1), and two light emitters, that are adjacent to each other, in the second emission region are spaced apart from each other by a second representative distance (e.g., the second distance 620, or the second distance D2) that is greater than the first representative distance (e.g., FIG. 6). The display device includes a filter coupled with the display panel for transmitting light projected by the display panel through the filter. The filter has a first filter region configured to change a direction of at least a portion of light emitted by the plurality of light emitters in the first emission region, and a second filter region that is mutually exclusive to the first filter region and configured to change a direction of at least a portion of light emitted by the plurality of light emitters in the second emission region. The first filter region is configured to cause a first distribution of light emitted from a first light emitter of the two light emitters in the first emission region, and a second distribution of light emitted from a second light emitter of the two light emitters in the first emission region so that the first distribution at least partially overlaps with the second distribution (e.g., FIGS. 10-11). The second filter region is configured to cause a third distribution of light emitted from a first light emitter of the two light emitters in the second emission region, and a fourth distribution of light emitted from a second light emitter of the two light emitters in the second emission region so that the third distribution at least partially overlaps with the fourth distribution (e.g., FIGS. 10-11).

In some embodiments, the third distribution has a distribution profile that corresponds to a distribution profile of the first distribution (e.g., FIG. 10).

In some embodiments, a distance from a light emitter in the second emission region to the second filter region is greater than a distance from a light emitter in the first emission region to the first filter region (e.g., FIGS. 8 and 9A-9B).

In some embodiments, the plurality of light emitters in the first emission region has a same distance to the first filter region (e.g., FIG. 9A). The plurality of light emitters in the second emission region has a same distance to the second filter region (e.g., FIG. 9A).

In some embodiments, a vertical distance from a light emitter, located in the first emission region adjacent to a border between the first emission region and the second emission region, to the first filter region is greater than a vertical distance from a light emitter, located in the first emission region adjacent to a center of the first emission region, to the first filter region (e.g., FIG. 9B).

In some embodiments, the first representative distance is a center-to-center spacing between the two light emitters in the first emission region that are adjacent to each other, and the second representative distance is a center-to-center spacing between the two light emitters in the second emission region that are adjacent to each other (e.g., the first center-to-center distance D1 and the second center-to-center distance D2 in FIG. 6).

In some embodiments, the first representative distance includes an edge-to-edge spacing between the two light emitters in the first emission region that are adjacent to each other, and the second representative distance includes an edge-to-edge spacing between the two light emitters in the second emission region that are adjacent to each other (e.g., the first edge-to-edge distance E1 and the second edge-to-edge distance E2 in FIG. 6).

In some embodiments, the filter is configured to change the direction of at least the portion of the light emitted by the plurality of light emitters in the first emission region, and at least the portion of the light emitted by the plurality of light emitters in the second emission region by at least one of: scattering at least the portion of the light emitted by the plurality of light emitters in the first emission region, and at least the portion of the light emitted by the plurality of light emitters in the second emission region, or causing diffraction of at least the portion of the light emitted by the plurality of light emitters in the first emission region, and at least the portion of the light emitted by the plurality of light emitters in the second emission region (e.g., FIGS. 8-11).

In some embodiments, the filter includes one or more filter elements for changing the direction of at least the portion of the light emitted by the plurality of light emitters in the first emission region, and at least the portion of the light emitted by the plurality of light emitters in the second emission region, wherein the one or more filter elements include at least one of: surface relief gratings, microstructured surfaces, diffraction gratings, volume holograms, or small-angle scattering elements (e.g., FIGS. 8-13).

In some embodiments, a magnitude of a directional change for the at least a portion of light emitted by the plurality of light emitters in the second emission region is greater than a magnitude of a directional change for the at least a portion of light emitted by the plurality of light emitters in the first emission region (e.g., FIG. 10).

In some embodiments, the magnitude of the directional change for at least the portion of the light emitted by the plurality of light emitters in the first emission region, and at least the portion of the light emitted by the plurality of light emitters in the second emission region is determined by at least one of a diffractive pattern pitch of the diffraction gratings, a hologram pitch of the volume holograms, or a scattering index for the small-angle scattering elements (e.g., FIGS. 12A-12D and 13A-13C).

In some embodiments, the filter includes dielectric posts disposed on a filter surface (e.g., FIGS. 12A-12D and 13A-13C).

In some embodiments, the first filter region is distinct from the second filter region, and is surrounded by the second filter region (e.g., FIGS. 8-11).

In some embodiments, the display panel has a plurality of emission regions, including the first emission region, the second emission region, and one or more additional emission regions. For any pair of emission regions selected from the plurality of emission regions, two light emitters, that are adjacent to each other, in an inner emission region of the pair of emission regions are spaced apart from each other by a representative distance that is less than a representative distance between two light emitters, that are adjacent to each other, in an outer emission region of the pair of emission regions, the inner emission region being surrounded by the outer emission region (e.g., FIGS. 4-8).

In some embodiments, the filter has a plurality of filter regions, including the first filter region, the second filter region, and one or more additional filter regions, that corresponds to the plurality of emission regions of the display panel (e.g., FIGS. 4-11).

In some embodiments, for any pair of filter regions selected from the plurality of filter regions that corresponds to the pair of emission regions, a distance from a light emitter in the outer emission region to a corresponding outer filter region is greater than a distance from a light emitter in the inner emission region to a corresponding inner filter region (e.g., FIGS. 4-11).

In accordance with some embodiments, a method for processing light projected by a display panel having a first emission region, and a second emission region that is mutually exclusive to the first emission region, and surrounds the first emission region, the method includes causing, with a first filter region configured to change a direction of at least a portion of light emitted by a plurality of light emitters arranged in the first emission region, a first distribution of light emitted from a first light emitter of two light emitters of the plurality of light emitters in the first emission region, and a second distribution of light emitted from a second light emitter of the two light emitters of the plurality of light emitters in the first emission region so that the first distribution at least partially overlaps with the second distribution (e.g., FIGS. 4-11).

The two light emitters, that are adjacent to each other, in the first emission region are spaced apart from each other by a first representative distance (e.g., FIGS. 4-11).

The method further includes causing, with a second filter region configured to change a direction of at least a portion of light emitted by a plurality of light emitters arranged in the second emission region, a third distribution of light emitted from a first light emitter of two light emitters of the plurality of light emitters in the second emission region, and a fourth distribution of light emitted from a second light emitter of the two light emitters of the plurality of light emitters in the second emission region so that the third distribution at least partially overlaps with the fourth distribution (e.g., FIGS. 4-11).

The two light emitters, that are adjacent to each other, in the second emission region are spaced apart from each other by a second representative distance that is greater than the first representative distance (e.g., FIGS. 4-11).

In some embodiments, a distance from a light emitter in the second emission region to the second filter region is greater than a distance from a light emitter in the first emission region to the first filter region (e.g., FIGS. 8-11).

In accordance with some embodiments, a head-mounted-display device includes one or more lenses, a display panel coupled with the one or more lenses for projecting light toward one or more eyes of a wearer through the one or more lenses, and a filter coupled with the display panel for transmitting light projected by the display panel through the filter (e.g., FIGS. 4-11).

The display panel includes a plurality of light emitters in a first emission region of the display panel, and a plurality of light emitters in a second emission region of the display panel that is distinct from and mutually exclusive to the first emission region and surrounds the first emission region. Two light emitters, that are adjacent to each other, in the first emission region are spaced apart from each other by a first representative distance, and two light emitters, that are adjacent to each other, in the second emission region are spaced apart from each other by a second representative distance that is greater than the first representative distance (e.g., FIGS. 4-11).

The filter has a first filter region configured to change a direction of at least a portion of light emitted by the plurality of light emitters in the first emission region, and a second filter region that is mutually exclusive to the first filter region and configured to change a direction of at least a portion of light emitted by the plurality of light emitters in the second emission region. The first filter region is configured to cause a first distribution of light emitted from a first light emitter of the two light emitters in the first emission region, and a second distribution of light emitted from a second light emitter of the two light emitters in the first emission region so that the first distribution at least partially overlaps with the second distribution. The second filter region is configured to cause a third distribution of light emitted from a first light emitter of the two light emitters in the second emission region, and a fourth distribution of light emitted from a second light emitter of the two light emitters in the second emission region so that the third distribution at least partially overlaps with the fourth distribution.

In some embodiments, a distance from a light emitter in the second emission region to the second filter region is greater than a distance from a light emitter in the first emission region to the first filter region (e.g., FIGS. 4-11).

In some embodiments, the first and second emission regions may comprise two different displays that are optically overlaid on each other, so that they appear to be one display to the user. For example, the display may have a waveguide display for a first field of view for the user, and a projected image display for areas that are within the field of view of the user, but outside the first field of view. In some embodiments, the two different displays include a first display having a first resolution and a second display having a second resolution that is lower than the first resolution. The optical overlay of the two displays can provide two emission regions having different spacing (e.g., center-to-center distances) between adjacent emitters.

In some embodiments, the optical filter includes a pass-through region. The pass-through region has little or no depixelization, whereas the first or second filter region has greater depixelization. In some embodiments, the pass-through region is surrounded by the first filter region (e.g., the pass-through region is located in the center of the optical filter). In some embodiments, an optical filter has the pass-through region and the first filter region without the second filter region.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A display device, comprising:
a display panel including:
a first array of light emitters having a first spacing in a first emission region of the display panel;
a second array of light emitters having a second spacing distinct from the first spacing in a second emission region of the display panel that is distinct from and mutually exclusive to the first emission region; and
an optical filter including:
a first filter region, wherein the first filter region changes distribution of first light from the first array of light emitters impinging on the first filter region so that the first light has a first distribution after passing through the first filter region; and
a second filter region distinct from the first filter region, wherein the second filter region changes distribution of second light from the second array of light emitters impinging on the second filter region so that the second light has a second distribution distinct from the first distribution after passing through the second filter region.

2. The display device of claim 1, wherein the first distribution is characterized by a first point spread function and the second distribution is characterized by a second point spread function that is distinct from the first point spread function.

3. The display device of claim 1, wherein the first distribution is characterized by a first distribution profile and the second distribution is characterized by a second distribution profile that is distinct from the first distribution profile.

4. The display device of claim 3, wherein the first distribution profile and the second distribution profile are characterized by at least one of: an intensity of respective distributed light, diffraction orders of the respective distributed light, or a diffraction angle of the respective distributed light.

5. The display device of claim 1, wherein the second spacing is greater than the first spacing.

6. The display device of claim 5, wherein the first array of light emitters is at least partially surrounded by the second array of light emitters.

7. The display device of claim 5, wherein:
the first spacing corresponds to a center-to-center distance between a first light emitter and a second light emitter, adjacent to each other, in the first array of light emitters; and
the second spacing corresponds to a center-to-center distance between a third light emitter and a fourth light emitter, adjacent to each other, in the second array of light emitters.

8. The display device of claim 5, wherein:
the first spacing corresponds to an edge-to-edge distance between a first light emitter and a second light emitter, adjacent to each other, in the first array of light emitters; and
the second spacing corresponds to an edge-to-edge distance between a third light emitter and a fourth light emitter, adjacent to each other, in the second array of light emitters.

9. The display device of claim 1, wherein:
a vertical distance from a first light emitter, located in the first array of light emitters adjacent to a border between the first array of light emitters and the second array of light emitters, to the first filter region is greater than a vertical distance from a second light emitter, located in the first array of light emitters adjacent to a center of the first array of light emitters, to the first filter region.

10. The display device of claim 9, wherein:
a vertical distance between the first array of light emitters and the first filter region increases linearly or non-linearly as a function of a distance from the center of the first array of light emitters to the border between the first array of light emitters and the second array of light emitters.

11. The display device of claim 9, wherein:
a vertical distance from a third light emitter, located in the second array of light emitters adjacent to the border between the first array of light emitters and the second array of light emitters, to the second filter region is greater than the vertical distance from the first light emitter, located in the first array of light emitters adjacent to the border between the first array of light emitters and the second array of light emitters, to the first filter region.

12. The display device of claim 1, wherein:
the optical filter is configured to change a direction of at least a portion of the first light emitted by the first array of light emitters in the first emission region and at least a portion of the second light emitted by the second array of light emitters in the second emission region by at least one of:
scattering at least the portion of the first light emitted by the first array of light emitters in the first emission region and at least the portion of the second light emitted by the second array of light emitters in the second emission region, or
causing diffraction of at least the portion of the first light emitted by the first array of light emitters in the first emission region and at least the portion of the second light emitted by the second array of light emitters in the second emission region.

13. The display device of claim 12, wherein:
the optical filter includes one or more filter elements for changing the direction of at least the portion of the first light emitted by the first array of light emitters in the first emission region and at least the portion of the second light emitted by the second array of light emitters in the second emission region, wherein the one or more filter elements include at least one of: surface relief gratings, microstructured surfaces, diffraction gratings, volume holograms, or small-angle scattering elements.

14. The display device of claim 13, wherein:
a magnitude of a directional change for at least the portion of the second light emitted by the second array of light emitters in the second emission region is greater than a magnitude of a directional change for at least the portion of the second light emitted by the first array of light emitters in the first emission region.

15. The display device of claim 14, wherein:
the magnitude of the directional change for at least the portion of the first light emitted by the first array of light emitters in the first emission region and at least the portion of the second light emitted by the second array of light emitters in the second emission region is determined by at least one of:
a diffractive pattern pitch of the diffraction gratings;
a hologram pitch of the volume holograms; or
a scattering index for the small-angle scattering elements.

16. A method, comprising:
emitting first light with a first array of light emitters having a first spacing in a first emission region of a display panel;
emitting second light with a second array of light emitters having a second spacing distinct from the first spacing in a second emission region of the display panel, the second emission region being distinct from and mutually exclusive to the first emission region;
changing, with a first filter region of an optical filter, distribution of the first light from the first array of light emitters impinging on the first filter region so that the first light has a first distribution after passing through the first filter region; and
changing, with a second filter region, distinct from the first filter region, of the optical filter, distribution of the second light from the second array of light emitters impinging on the second filter region so that the second light has a second distribution distinct from the first distribution after passing through the second filter region.

17. The method of claim 16, wherein the first distribution is characterized by a first point spread function and the second distribution is characterized by a second point spread function that is distinct from the first point spread function.

18. The method of claim 16, wherein the first distribution is characterized by a first distribution profile and the second distribution is characterized by a second distribution profile that is distinct from the first distribution profile.

19. The method of claim 18, wherein the first distribution profile and the second distribution profile are characterized by an intensity of respective distributed light, diffraction orders of the respective distributed light, and/or a diffraction angle of the respective distributed light.

20. The method of claim 16, the second spacing is greater than the first spacing.

* * * * *